(12) United States Patent
Ngu et al.

(10) Patent No.: US 12,738,865 B2
(45) Date of Patent: Sep. 15, 2026

(54) MULTILEVEL INVERTER SYSTEM INCLUDING X-TYPE MULTILEVEL CONVERTERS HAVING MUTUAL INDUCTANCE CANCELLATION

(71) Applicant: GM GLOBAL TECHNOLOGY OPERATIONS LLC, Detroit, MI (US)

(72) Inventors: Benjamin S. Ngu, Rochester Hills, MI (US); Chandra S. Namuduri, Troy, MI (US); Yilun Luo, Ann Arbor, MI (US); Khorshed Mohammed Alam, Canton, MI (US); Rashmi Prasad, Troy, MI (US); Richard M. Nichols, III, Macomb, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 169 days.

(21) Appl. No.: 18/938,842

(22) Filed: Nov. 6, 2024

(65) Prior Publication Data

US 2026/0128681 A1 May 7, 2026

(51) Int. Cl.
*H02M 7/537* (2006.01)
*B60L 15/00* (2006.01)
(Continued)

(52) U.S. Cl.
CPC ........... *H02M 7/537* (2013.01); *B60L 15/007* (2013.01); *H02M 7/003* (2013.01); *H05K 7/14329* (2022.08); *B60L 2210/40* (2013.01)

(58) Field of Classification Search
CPC .... H02M 7/537; H02M 7/003; H02M 1/0054; H02M 1/008; H02M 7/487; H02M 7/49;
(Continued)

(56) References Cited

U.S. PATENT DOCUMENTS

2023/0238895 A1* 7/2023 Moon .................. H02M 7/487 363/40

FOREIGN PATENT DOCUMENTS

DE 102008036112 A1 2/2009
DE 102019115498 A1 12/2020
(Continued)

*Primary Examiner* — Crystal L Hammond
*Assistant Examiner* — Jonathan Walter Soileau
(74) *Attorney, Agent, or Firm* — Quinn IP Law

(57) ABSTRACT

A multi-phase power inverter for an electric propulsion system including a plurality of X-type multilevel power converters arranged as solid-state integrated circuits. Each X-type multilevel power converter includes a positive direct current (DC) power bus, a negative DC power bus, a first alternating current (AC) bus, a second AC power bus, a first clamping diode, a second clamping diode, a power module substrate disposed on an insulating substrate, and a heat sink adjacent to a first side of the insulating substrate. The power module substrate includes a plurality of semiconductor switches, each including a plurality of lateral semiconductor dies each having gate control terminals. The plurality of semiconductor switches, the first clamping diode, and the second clamping diode are coplanar, with the DC power terminals on one side of the X-type multilevel power converter, and the auxiliary and output terminals disposed on the opposite side.

20 Claims, 13 Drawing Sheets

(51) Int. Cl.
*H02M 7/00* (2006.01)
*H05K 7/14* (2006.01)

(58) Field of Classification Search
CPC .. H02M 7/483; B60L 15/007; B60L 2210/40; B60L 2210/46; H05K 7/14329
See application file for complete search history.

(56) References Cited

FOREIGN PATENT DOCUMENTS

| | | | |
|---|---|---|---|
| DE | 102022111517 | A1 | 11/2023 |
| JP | 08214561 | A | 8/1996 |

* cited by examiner

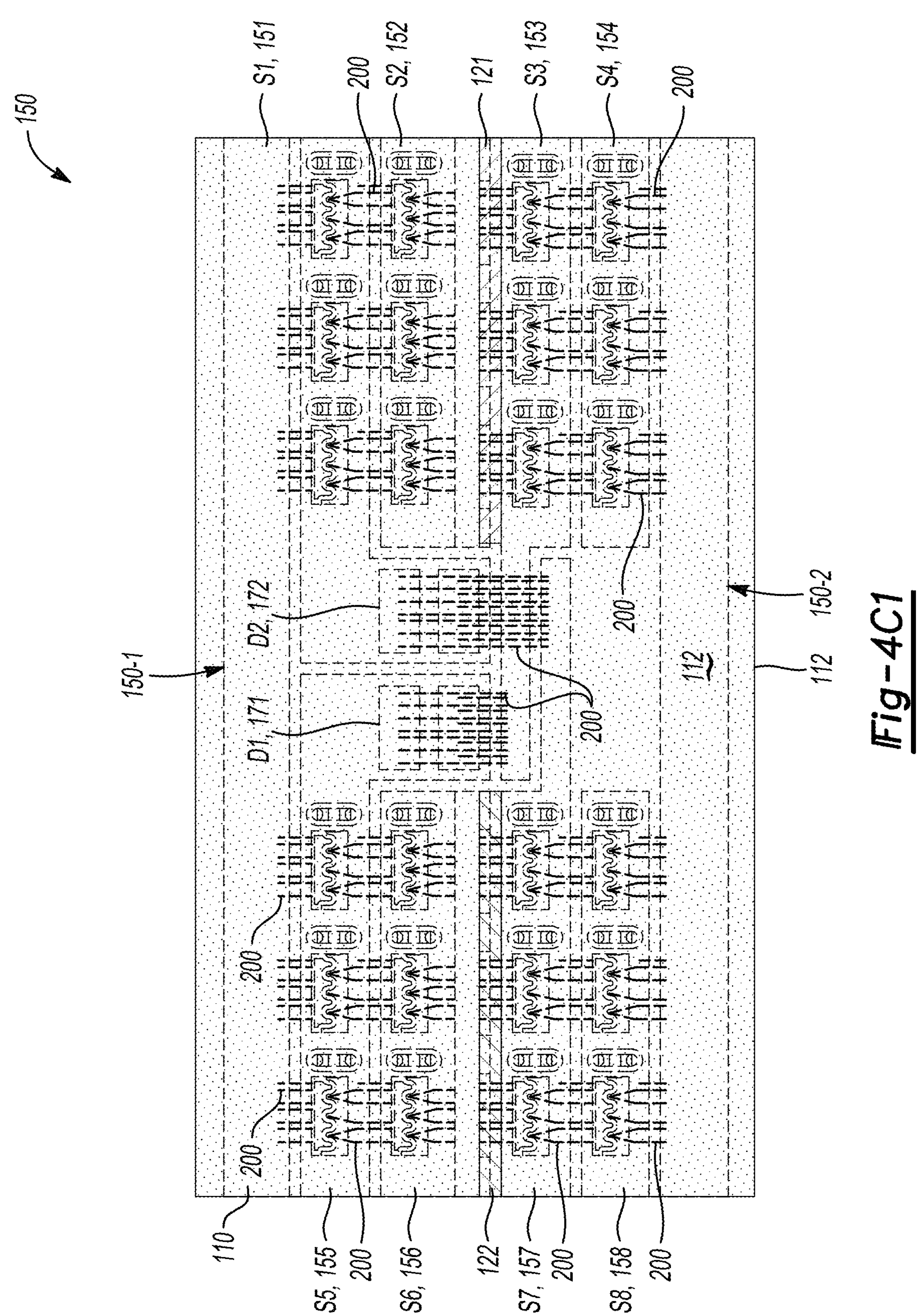
Fig-4C1

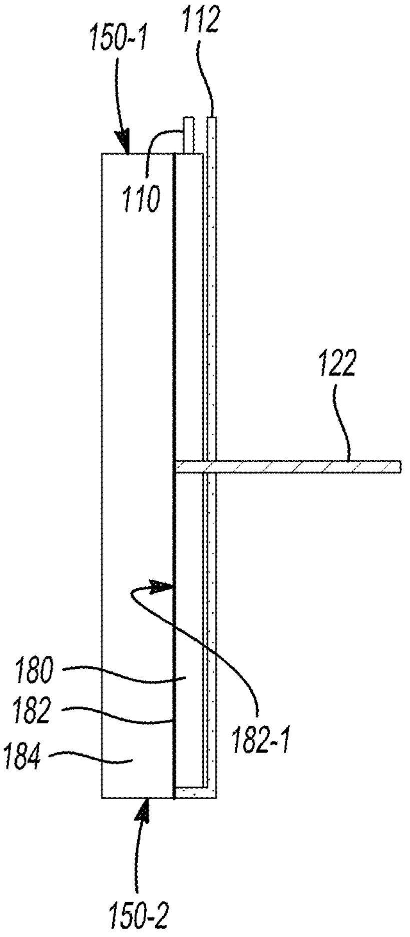
Fig-4C2

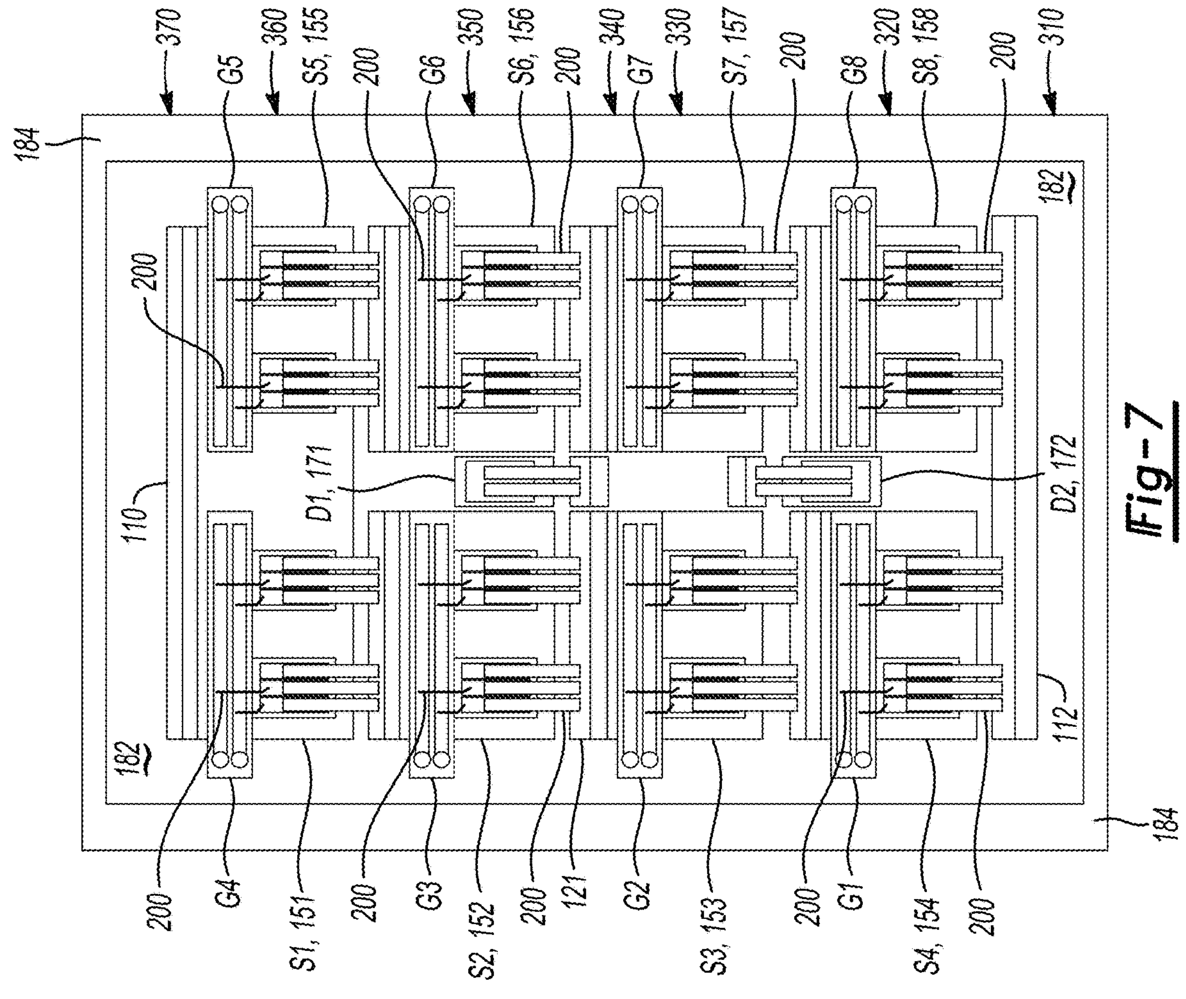
*Fig-7*
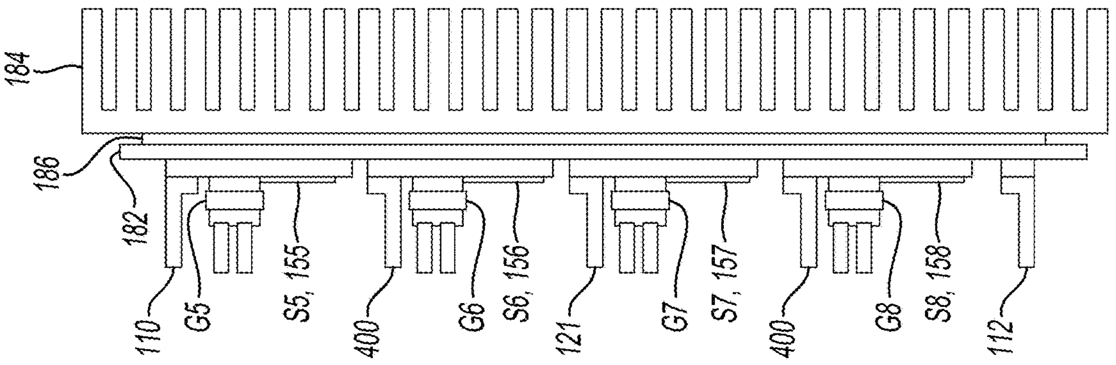

MULTILEVEL INVERTER SYSTEM INCLUDING X-TYPE MULTILEVEL CONVERTERS HAVING MUTUAL INDUCTANCE CANCELLATION

STATEMENT OF FEDERALLY SPONSORED RESEARCH OR DEVELOPMENT

This invention was made with government support under Agreement No. DE-EE0010596 awarded by the U.S. Department of Energy (DOE). The government has certain rights in the invention.

INTRODUCTION

The concepts described herein relate generally to vehicles employing electrified powertrain or propulsion systems, which are composed with direct current (DC) power supplies that provide DC electric power, which is converted to alternating current (AC) electric power via multi-phase power inverters, to control operation of one or multiple electric machines.

High-voltage and high-power multilevel inverters (MLIs) have gained attention as the transportation electrification trend of consumer and commercial vehicles is rapidly expanding towards high-capacity mass transit systems such as electric aircraft, trains, and ships. MLIs such as neutral point clamped (NPC) and T-type inverters provide high-voltage and high-power operation capabilities but include stacked DC-link capacitors with a neutral point connection for zero voltage vector. This neutral point connection to the stacked DC-link capacitor may generate a neutral current oscillating at three times the fundamental frequency, which may cause capacitor voltage imbalance and overvoltage stress on capacitors and switching devices.

A multi-phase inverter circuit may generate an inherent power loop in which high current flows from a DC-link capacitor to a high-side of the multilevel power inverter, then to a low-side of the multilevel power inverter and back. The power loop may generate a magnetic field, which forms parasitic inductance.

As multi-phase power inverters may operate at higher switching frequencies, even small levels of parasitic inductance may lead to issues, for example, but not limited to, ringing and/or electromagnetic interference (EMI).

The current flow path determines the size of the power loop, which determines the size of the magnetic field generated, and hence the size of the parasitic inductance. The current flow path is defined by the topology of the circuit, and therefore the topology of the circuit may affect the size of the parasitic inductance.

As an X-type multilevel inverter can include a current flow path through a pair of external X-diodes, a length of the power loop is increased resulting in increased parasitic inductance.

SUMMARY

In view of the above discussion, it is useful to develop a system of integrating power semiconductor devices including selective active and passive vertical and/or lateral semiconductor dies to effect mutual inductance cancellation for a multi-phase power inverter including a plurality of X-type multilevel power converters having a topology that reduces parasitic inductance within the multi-phase power inverter and/or within each X-type multilevel power converter.

The concepts disclosed herein relate to a system for a multi-phase power inverter including a plurality of X-type multilevel power converters that achieve mutual inductance cancellation. Such a system may be used in vehicles having an electrified propulsion system, for example, but not limited to, a motor vehicle having an electrified powertrain or propulsion system, e.g., an electric vehicle (EV) or plug-in hybrid electric vehicle (PHEV), or another mobile platform, which may be powered by an electric propulsion system, to reduce parasitic inductance within the multi-phase power inverter.

Each multi-phase power inverter may include a plurality of X-type multilevel power converters arranged between a high-voltage direct current (DC) power source and an electric machine. The number of X-type multilevel power converters required is application specific.

Each X-type multilevel power converter may be configured as a solid-state integrated circuit (IC) that includes a plurality of circuit components, for example, but not limited to semiconductor switches and busbars, which are connected to form a network of interconnections through which current may flow. The form of this network of interconnected circuitry is called a circuit topology.

The concepts described herein provide a multi-phase power inverter that is advantageously arranged to minimize stray inductance and loop inductance employing magnetic field cancellation. This includes using cancelling fields by arranging positive, neutral and negative buses and a plurality of X-type multilevel power converters arranged in solid-state integrated circuits having laterally sectioned elements. The arrangement of the X-type multilevel power converters with laterally sectioned elements enables either single-sided or double-sided cooling to reduce thermal impedance. This configuration may serve to reduce stray inductance, thus leading to lower switching loss, less ringing, less electromagnetic interference (EMI), and lower device thermal stress.

A multi-phase power inverter may include a plurality of X-type multilevel power converters arranged to transfer electric power between a high-voltage direct current (DC) power source and an electric machine. Each of the plurality of X-type multilevel power converters may be configured as a solid-state integrated circuit (IC).

The at least one X-type multilevel power converter may include a positive DC power bus, a negative DC power bus, a first alternating current (AC) bus, a second AC power bus, a first clamping diode, a second clamping diode, a power module substrate disposed on an insulating substrate, and a heat sink adjacent to a first side of the insulating substrate.

The power module substrate may include a plurality of semiconductor switches including a first semiconductor switch, a second semiconductor switch, a third semiconductor switch, a fourth semiconductor switch, a fifth semiconductor switch, a sixth semiconductor switch, a seventh semiconductor switch, and an eighth semiconductor switch.

The first semiconductor switch, the second semiconductor switch, the third semiconductor switch, and the fourth semiconductor switch may be connected in series between the positive DC power bus and the negative DC power bus.

The first semiconductor switch may be connected to the second semiconductor switch at a first node. The second semiconductor switch may be connected to the third semiconductor switch at a second node, and the third semiconductor switch may be connected to the fourth semiconductor switch at a third node.

The fifth semiconductor switch, the sixth semiconductor switch, the seventh semiconductor switch, and the eighth semiconductor switch may be connected in series between the positive DC power bus and the negative DC power bus.

The fifth semiconductor switch may be connected to the sixth semiconductor switch at a fourth node. The sixth semiconductor switch may be connected to the seventh semiconductor switch at a fifth node, and the seventh semiconductor switch may be connected to the eighth semiconductor switch at a sixth node.

The first clamping diode may be connected between the third node and the fourth node. The second clamping diode may be connected between the first node and the sixth node.

The second node may be connected to the first AC power bus and the fifth node may be connected to the second AC power bus.

Each of the plurality of semiconductor switches may include a plurality of lateral semiconductor dies that may include gate control terminals.

The plurality of semiconductor switches, the first clamping diode, and the second clamping diode may be coplanar.

The first AC power bus and the second AC power bus may be coplanar.

The first AC power bus and the second AC power bus may be parallel to one another and/or laminated.

The positive DC power bus and the negative DC power bus may also be parallel to one another.

Each of the first AC power bus, the second AC power bus, the positive DC power bus, and the negative DC power bus may extend past a top edge of the X-type multilevel power converter.

The positive DC power bus and the negative DC power bus may extend past a top edge of the X-type multilevel power converter, and the first AC power bus and the second AC power bus may extend past a bottom edge of the X-type multilevel power converter.

According to one aspect of the disclosure, the positive DC power bus and the negative DC power bus may extend past a top edge of the X-type multilevel power converter, and the first AC power bus and the second AC power bus may extend perpendicularly to the X-type multilevel power converter from a middle portion of the X-type multilevel power converter.

Interconnections may include one or more of wire bonding, ribbon bonding, clip bonding, and direct copper bus bonding.

According to another aspect of the disclosure, a multi-phase power inverter may include a plurality of X-type multilevel power converters arranged to transfer electric power between a high-voltage direct current (DC) power source and an electric machine.

Each of the plurality of X-type multilevel power converters may be a solid-state integrated circuit (IC).

The at least one X-type multilevel power converter may include a positive DC power bus, a negative DC power bus, a first alternating current (AC) bus, a first auxiliary bus, a second auxiliary bus, a plurality of semiconductor switches disposed on an insulating substrate board, the plurality of semiconductor switches including a first semiconductor switch, a second semiconductor switch, a third semiconductor switch, and a fourth semiconductor switch, and a heat sink adjoined to the insulating substrate board via a thermally conductive interface material.

The first semiconductor switch, the second semiconductor switch, the third semiconductor switch, and the fourth semiconductor switch may be connected in series between the positive DC power bus and the negative DC power bus.

The first semiconductor switch may be connected to the second semiconductor switch at a first node. The second semiconductor switch may be connected to the third semiconductor switch at a second node, and the third semiconductor switch may be connected to the fourth semiconductor switch at a third node.

The first node may be connected to the first auxiliary bus. The second node may be connected to the first AC power bus, and the third node may be connected to the second auxiliary bus.

The plurality of semiconductor switches, the positive DC power bus, the negative DC power bus, the first auxiliary bus, and the second auxiliary bus may be arranged in sections including a first section composed of the first AC power bus, a second section composed of the second semiconductor switch arranged coplanar with the third semiconductor switch, a third section composed of the first auxiliary bus arranged coplanar with the second auxiliary bus, a fourth section composed of the first semiconductor switch arranged coplanar with the fourth semiconductor switch, and a fifth section composed of the positive DC power bus arranged coplanar with the negative DC power bus.

The first section may be adjacent to the second section that may be adjacent to the third section that may be adjacent to the fourth section that may be adjacent to the fifth section.

The first AC power bus may be arranged parallel to the positive DC power bus and the negative DC power bus.

A first gate control may be arranged between the first section and the second section and may be disposed adjacent to the first AC power bus and the third semiconductor switch.

A second gate control may be arranged between the second section and the third section and may be disposed adjacent to the second semiconductor switch and the first auxiliary bus.

A third gate control may be arranged between the third section and the fourth section and may be disposed adjacent to the second auxiliary bus and the fourth semiconductor switch.

A fourth gate control may be arranged between the fourth section and the fifth section and may be disposed adjacent to the first semiconductor switch and the positive DC power bus.

The first gate control may be arranged coplanar with the second gate control that may be arranged coplanar with the third gate control that may be arranged coplanar with the fourth gate control.

According to one aspect of the disclosure, a third auxiliary bus may be connected to a fourth node.

A first clamping diode may be connected between the first node and the fourth node and a second clamping diode may be connected between the fourth node and the third node.

The plurality of semiconductor switches, the positive DC power bus, the negative DC power bus, the first auxiliary bus, the second auxiliary bus, the third auxiliary bus may be arranged in sections including a first section composed of the negative DC power bus, a second section composed of the fourth semiconductor switch and the second clamping diode, a third section composed of the third semiconductor switch, the first AC power bus, and the third auxiliary bus, a fourth section composed of the second semiconductor switch and the first clamping diode, and a fifth section composed of the first semiconductor switch and the positive DC power bus.

The first section may be adjacent to the second section that may be adjacent to the third section that may be adjacent to the fourth section that may be adjacent to the fifth section.

The first AC power bus may be arranged parallel to the positive DC power bus and the negative DC power bus.

A first gate control may be arranged adjacent to the fourth semiconductor switch. A second gate control may be arranged adjacent to the third semiconductor switch. A third gate control may be arranged adjacent to the second semiconductor switch and a fourth gate control may be arranged adjacent to the first semiconductor switch.

The first gate control may be arranged coplanar with the second gate control that may be arranged coplanar with the third gate control that may be arranged coplanar with the fourth gate control.

According to one aspect of the disclosure, the power module may further include a first clamping diode, a second clamping diode, and a second AC power bus.

The plurality of semiconductor switches may further include a fifth semiconductor switch, a sixth semiconductor switch, a seventh semiconductor switch, and an eighth semiconductor switch.

The fifth semiconductor switch, the sixth semiconductor switch, the seventh semiconductor switch, and the eighth semiconductor switch may be connected in series between the positive DC power bus and the negative DC power bus.

The fifth semiconductor switch may be connected to the sixth semiconductor switch at a fourth node. The sixth semiconductor switch may be connected to the seventh semiconductor switch at a fifth node, and the seventh semiconductor switch may be connected to the eighth semiconductor switch at a sixth node.

The first clamping diode may be connected between the third node and the fourth node and the second clamping diode may be connected between the first node and the sixth node.

The second node may be connected to the first AC power bus and the fifth node may be connected to the second AC power bus.

The plurality of semiconductor switches, the positive DC power bus, the negative DC power bus, the first AC power bus, the second AC power bus, the first clamping diode, and the second clamping diode may be arranged into a plurality of sections including a first section composed of the negative DC power bus, a second section composed of the fourth semiconductor switch arranged coplanar with the second clamping diode that is arranged coplanar with the eighth semiconductor switch, a third section composed of the third semiconductor switch arranged coplanar with the seventh semiconductor switch, a fourth section composed of the first AC power bus and the second AC power bus, a fifth section composed of the second semiconductor switch arranged coplanar with the first clamping diode that is arranged coplanar with the sixth semiconductor switch, a sixth section composed of the first semiconductor switch arranged coplanar with the fifth semiconductor switch, and a seventh section composed of the positive DC power bus.

The first section may be adjacent to the second section that may be adjacent to the third section that may be adjacent to the fourth section that may be adjacent to the fifth section that may be adjacent to the sixth section.

The first AC power bus and the second AC power bus may be arranged parallel to the positive DC power bus and the negative DC power bus.

A plurality of gate controls may include a first gate control arranged adjacent to the fourth semiconductor switch, a second gate control arranged adjacent to the third semiconductor switch, a third gate control arranged adjacent to the second semiconductor switch, a fourth gate control arranged adjacent to the first semiconductor switch, a fifth gate control arranged adjacent to the fifth semiconductor switch, a sixth gate control arranged adjacent to the sixth semiconductor switch, a seventh gate control arranged adjacent to the seventh semiconductor switch, and an eighth gate control arranged adjacent to the eighth semiconductor switch.

The first gate control may be arranged coplanar with the second gate control that may be arranged coplanar with the third gate control that may be arranged coplanar with the fourth gate control that may be coplanar with the fifth gate control that may be coplanar with the sixth gate control that may be coplanar with the seventh gate control that may be coplanar with the eighth gate control.

An electrified vehicle is also disclosed. The electrified vehicle may include an electric propulsion system having an electric motor configured to provide power to the electric propulsion system.

A plurality of X-type multilevel power converters may be arranged to transfer electric power between a high-voltage direct current (DC) power source and an electric machine. Each of the plurality of X-type multilevel power converters may be a solid-state integrated circuit (IC).

The X-type multilevel power converter may include a positive DC power bus, a negative DC power bus, a first alternating current (AC) bus, a second AC power bus, a first clamping diode, a second clamping diode, a power module substrate disposed on an insulating substrate, and a heat sink adjacent to a first side of the insulating substrate.

The power module substrate may include a plurality of semiconductor switches including a first semiconductor switch, a second semiconductor switch, a third semiconductor switch, a fourth semiconductor switch, a fifth semiconductor switch, a sixth semiconductor switch, a seventh semiconductor switch, and an eighth semiconductor switch.

The first semiconductor switch, the second semiconductor switch, the third semiconductor switch, and the fourth semiconductor switch may be connected in series between the positive DC power bus and the negative DC power bus.

The first semiconductor switch may be connected to the second semiconductor switch at a first node. The second semiconductor switch may be connected to the third semiconductor switch at a second node, and the third semiconductor switch may be connected to the fourth semiconductor switch at a third node.

The fifth semiconductor switch, the sixth semiconductor switch, the seventh semiconductor switch, and the eighth semiconductor switch may be connected in series between the positive DC power bus and the negative DC power bus.

The fifth semiconductor switch may be connected to the sixth semiconductor switch at a fourth node. The sixth semiconductor switch may be connected to the seventh semiconductor switch at a fifth node, and the seventh semiconductor switch may be connected to the eighth semiconductor switch at a sixth node.

The first clamping diode may be connected between the third node and the fourth node and the second clamping diode may be connected between the first node and the sixth node.

The second node may be connected to the first AC power bus and the fifth node may be connected to the second AC power bus.

Each of the plurality of semiconductor switches may include a plurality of lateral semiconductor dies, which may include gate control terminals.

The plurality of semiconductor switches, the first clamping diode, and the second clamping diode may be coplanar.

The first AC power bus and the second AC power bus may be parallel to one another.

By configuring the topology within each of the X-type multilevel converters such that both the positive DC power bus and the negative DC power bus are parallel with the auxiliary or neutral bus, mutual inductance cancellation minimizes parasitic inductance by coupling positive mutual inductance and negative mutual inductance for commutation loop currents within each of the X-type multilevel converters.

The above features and advantages, and other features and attendant advantages of this disclosure, will be readily apparent from the following detailed description of illustrative examples and modes for carrying out the present disclosure when taken in connection with the accompanying drawings and the appended claims. Moreover, this disclosure expressly includes combinations and sub-combinations of the elements and features presented above and below.

BRIEF DESCRIPTION OF THE DRAWINGS

The accompanying drawings, which are incorporated into and constitute a part of this specification, illustrate implementations of the disclosure which, taken together with the description, serve to explain the principles of the disclosure.

FIG. 4C1 schematically illustrates a top view of an X-type multilevel power converter, in accordance with one aspect of the disclosure.

FIG. 4C2 schematically illustrates a side view of the X-type multilevel power converter illustrated in FIG. 4C1, in accordance with one aspect of the disclosure.

FIG. 7 schematically illustrates a top view of an X-type multilevel power converter, in accordance with one aspect of the disclosure.

Figure 1:
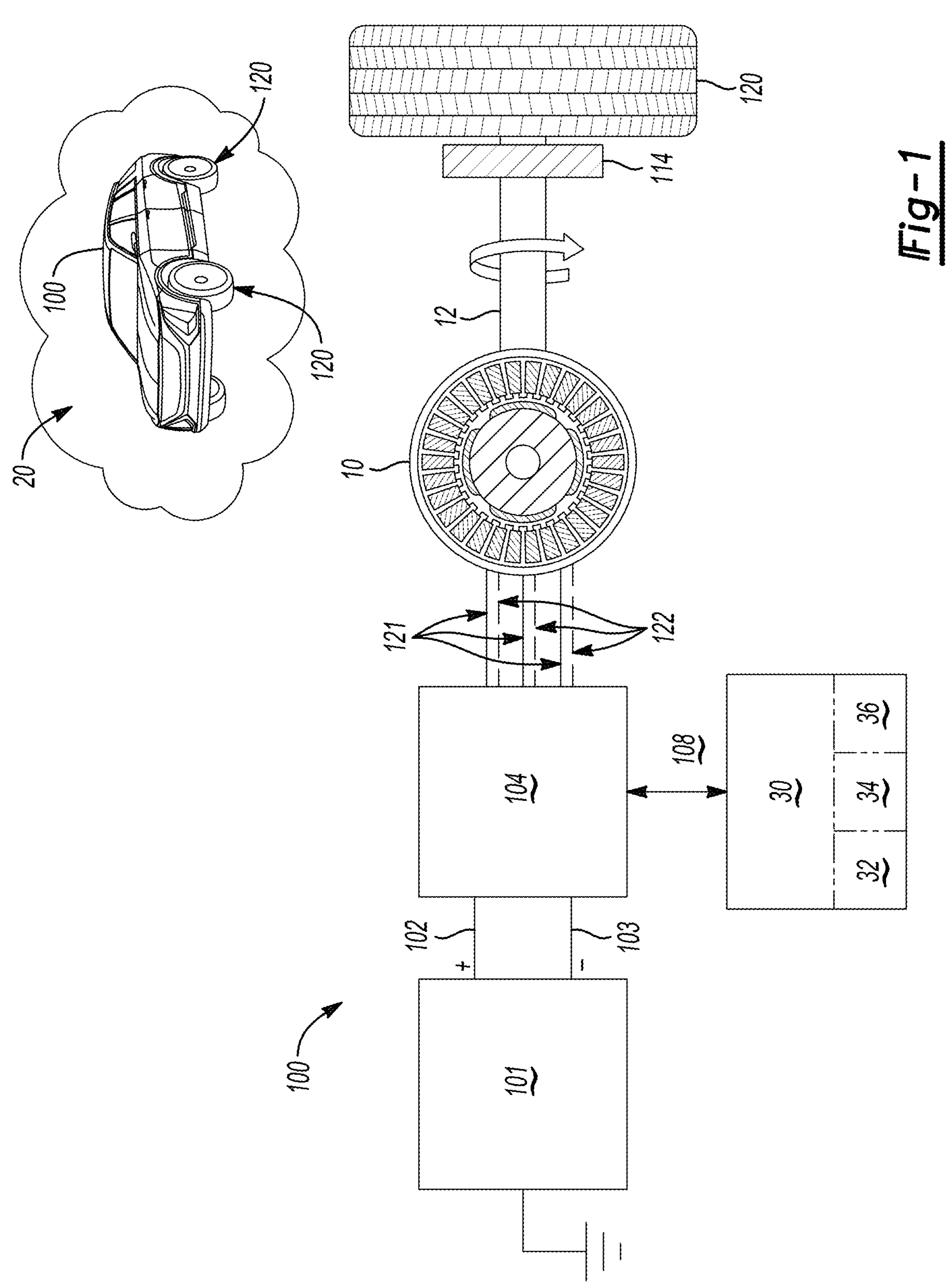
FIG. 1 schematically illustrates an electric drivetrain system including a multi-phase power inverter that is arranged between a high-voltage direct current (DC) power source and an electric machine, in accordance with the disclosure.

The appended drawings are not necessarily to scale and may present a somewhat simplified representation of various preferred features of the present disclosure as disclosed herein, including, for example, specific dimensions, orientations, locations, and shapes. Details adjacent to such features will be determined in part by the particular intended application and use environment.

DETAILED DESCRIPTION

The components of each aspect of the disclosure, as described and illustrated herein, may be arranged and designed in a variety of different configurations. Thus, the following detailed description is not intended to limit the scope of the disclosure, as claimed, but is merely representative of possible aspect of the disclosure thereof. In addition, while numerous specific details are set forth in the following description in order to provide a thorough understanding of each aspect of the disclosure disclosed herein, some aspects of the disclosure may be practiced without some of these details. Moreover, for the purpose of clarity, certain technical material that is understood in the related art has not been described in detail in order to avoid unnecessarily obscuring the disclosure. Furthermore, the disclosure, as illustrated and described herein, may be practiced in the absence of an element that is not specifically disclosed herein.

The present disclosure is susceptible to embodiment in many different forms. Representative examples of the disclosure are shown in the drawings and described herein in detail as non-limiting examples of the disclosed principles. To that end, elements and limitations described herein, but not explicitly set forth in the claims, are not to be incorporated into the claims, singly or collectively, by implication, inference, or otherwise.

For purposes of the present description, unless specifically disclaimed, use of the singular includes the plural and vice versa, the terms "and" and "or" shall be both conjunctive and disjunctive, and the words "including," "containing," "comprising," "having," and the like shall mean "including without limitation." Moreover, words of approximation such as "about," "almost," "substantially," "generally," "approximately," etc., may be used herein in the sense of "at, near, or nearly at," or "within 0-5% of," or "within acceptable manufacturing tolerances," or logical combinations thereof.

As used herein, the term "system" refers to mechanical and electrical hardware, software, firmware, electronic control componentry, processing logic, and/or processor device, individually or in combination, including without limitation: application specific integrated circuit (ASIC), an electronic circuit, a processor (shared, dedicated, or group) that executes one or more software or firmware programs, memory device(s) that electrically store software or firmware instructions, a combinatorial logic circuit, and/or other components that provide the described functionality.

As employed herein, terms such as "vertical", "horizontal", "left", "right", "upper", "lower", "top", "bottom" and similar expressions are non-limiting terms that merely describe the various elements as illustrated in the Figures and are not intended to limit the scope of the disclosure.

As used herein, the term "electric machine" refers to an electric motor/generator device including a rotor and a stator that is capable of converting electric power to mechanical power and/or converting mechanical power to electric power by electromagnetic effort.

Figure 2:
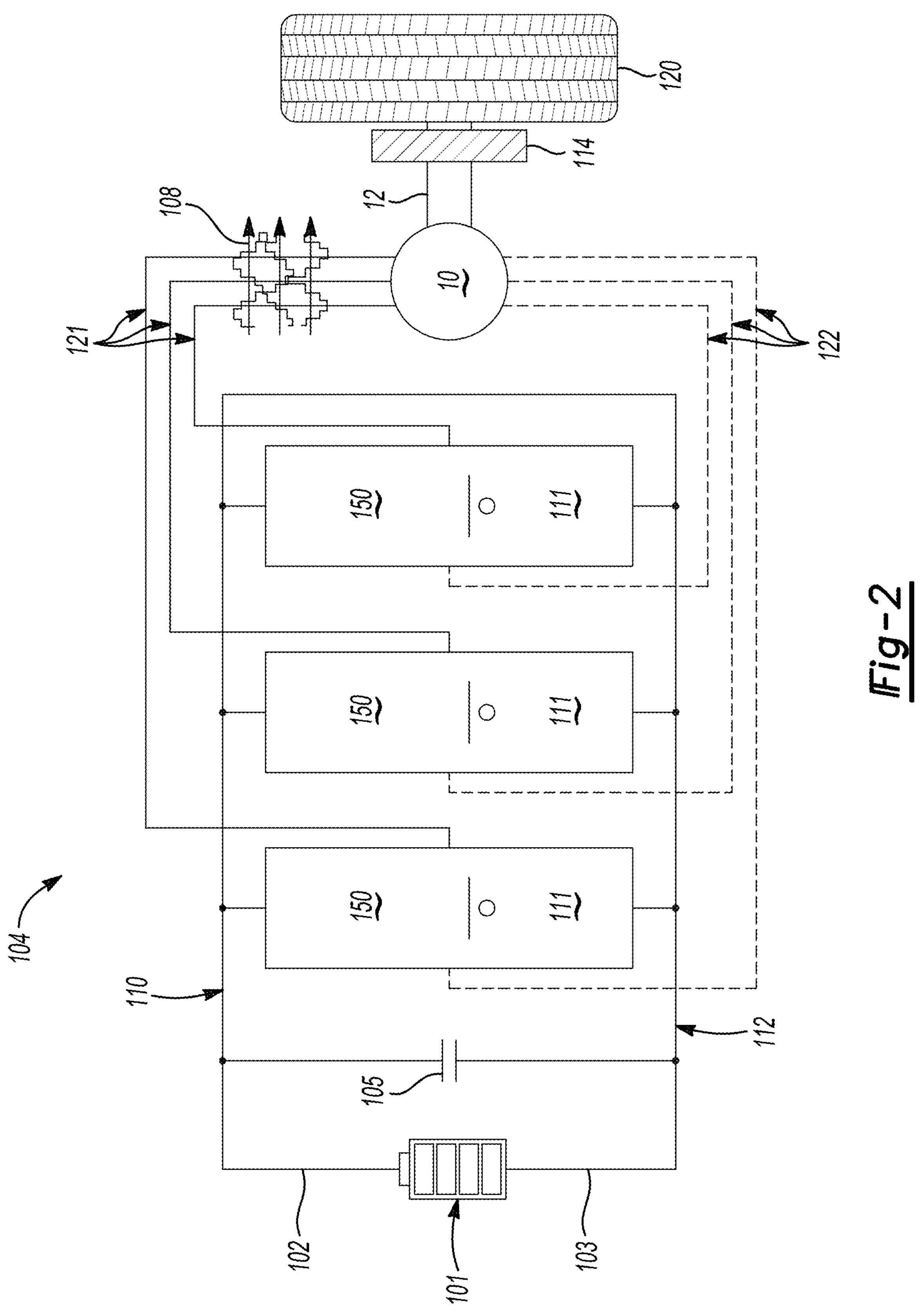
FIG. 2 schematically illustrates an electric drivetrain system including a multi-phase power inverter includes a plurality of X-type multilevel power converters that are arranged between a high-voltage DC power source and an electric machine, in accordance with the disclosure.

Referring to the drawings, wherein like reference numbers refer to the same or like components in the several Figures, FIGS. 1 and 2 schematically illustrate an electric drivetrain 100 that is composed of a direct current (DC) power source 101, a multi-phase power inverter 104, a multi-phase rotary electric motor, generator, or motor-generator (electric machine) 10, and a torque actuator 120, the operations of which are monitored and controlled by a controller 30. In one aspect of the disclosure, the electric drivetrain 100 is arranged to generate and transfer torque to the torque actuator 120 in the form of one or multiple drive wheels to effect work. Controller 30 executes control routines to control and manage operation of the multi-phase power inverter 104. In one aspect of the disclosure, the electric drivetrain 100 is disposed on an electrified vehicle, schematically illustrated at 20, and capable of generating tractive torque for vehicle propulsion. When disposed on the electrified vehicle 20, the electrified vehicle 20 may include, but not be limited to a mobile platform in the form of a commercial vehicle, industrial vehicle, agricultural vehicle, passenger vehicle, aircraft, watercraft, train, all-terrain vehicle, personal movement apparatus, robot and the like to accomplish the purposes of this disclosure. Alternatively, the electric drivetrain 100 may be an element of a stationary system.

The controller 30 may be embodied as one or more digital computing devices, and may include one or more processors 34 and memory 32. A control routine 36 may be stored as an executable instruction set in the memory 32 and executed by one of the processors 34 of the controller 30. The controller 30 is in communication with the multi-phase power inverter 104 to control operation thereof in response to execution of the control routine 36 to operate the electric machine 10. The multi-phase power inverter 104 exchanges or transfers electric power to the electric machine 10 via a plurality of first AC power buses 121 and second AC power buses 122.

The term "controller" and related terms such as microcontroller, control module, module, control, control unit, processor and similar terms refer to one or various combinations of Application Specific Integrated Circuit(s) (ASIC), Field-Programmable Gate Array (FPGA), electronic circuit(s), central processing unit(s), e.g., microprocessor(s) and associated memory component(s) in the form of transitory and/or non-transitory memory component(s) and storage devices (read only, programmable read only, random access, hard drive, etc.). The non-transitory memory component is capable of storing machine readable instructions in the form of one or more software or firmware programs or routines, combinational logic circuit(s), input/output circuit(s) and devices, signal conditioning and buffer circuitry and other components that may be accessed by one or more processors to provide a described functionality. Input/output circuit(s) and devices include analog/digital inverters and related devices that monitor inputs from sensors, with such inputs monitored at a preset sampling frequency or in response to a triggering event. Software, firmware, programs, instructions, control routines, code, algorithms and similar terms mean controller-executable instruction sets including calibrations and look-up tables.

The electric machine 10 includes a cylindrically-shaped rotor assembly arranged on a rotor shaft and disposed within an annularly-shaped stator, wherein the rotor assembly is coaxial with a rotor opening that is formed in the stator. Other elements of the electric machine 10, e.g., end caps, shaft bearings, electrical connections, etc., are included but not shown. Electrical windings of the stator are arranged with a quantity of electrical phases and a quantity of electrical turns per phase. Depending on the specific arrangement, the quantity of electrical phases may be between 3 and 6, and the quantity of layers of conductors may be between 4 and 12.

The multi-phase power inverter 104 includes a plurality of semiconductor switches (illustrated with reference to FIG. 3, et seq.) that are arranged and controllable to transform direct current (DC) electric power to alternating current (AC) electric power, and transform AC electric power to DC electric power, employing a pulse-width modulation signal 108 or another control technique. The multi-phase power inverter 104 is arranged and is controllable to transform DC electric power originating from the high-voltage DC power source 101 to AC electric power to actuate the electric machine 10 via electromagnetic effort. The electric machine 10 is controllable to rotate and generate mechanical torque that is transferred via a rotatable member 12 and a geartrain 114 to the torque actuator 120 when operating in a torque generating mode. The electric machine 10 is controllable to generate AC electric power from mechanical torque originating at the torque actuator 120 via electromagnetic effort, which is transformed by the multi-phase power inverter 104 to DC electric power for storage in the high-voltage DC power source 101 when operating in an electric power generating mode. The torque actuator 120 includes, in one aspect of the disclosure, a vehicle wheel that transfers torque to a ground surface to effect forward motion as part of a traction propulsion system. The high-voltage DC power source 101 may be in the form of a rechargeable electrochemical battery device, a fuel cell, an ultracapacitor, and/or another electrical energy storage/generation technology.

The high-voltage DC power source 101 may be a rechargeable electrochemical battery device, a fuel cell, an ultracapacitor, and/or another electrical energy storage/generation technology. The high-voltage DC power source 101 connects to the multi-phase power inverter 104 via a high-voltage DC bus having a positive link 102 and a negative link 103, and the multi-phase power inverter 104 connects to the electric machine 10 via a plurality of first AC power buses 121 and second AC power buses 122 to transfer the pulse-width modulation signal 108.

As illustrated with reference to FIG. 2, the multi-phase power inverter 104 of the electric drivetrain 100 is composed with a plurality of X-type multilevel power converters 150 that are arranged between the high-voltage DC power source 101 and the electric machine 10, with a DC-link capacitor 105 between the high-voltage DC power source 101 and the multi-phase power inverter 104 of the electric drivetrain 100, and with respective first AC power buses 121 and second AC power buses 122. As illustrated, and in one non-limiting aspect of the disclosure, the multi-phase power inverter 104 of the electric drivetrain 100 is composed with a quantity of three of the X-type multilevel power converters 150.

Figure 3:
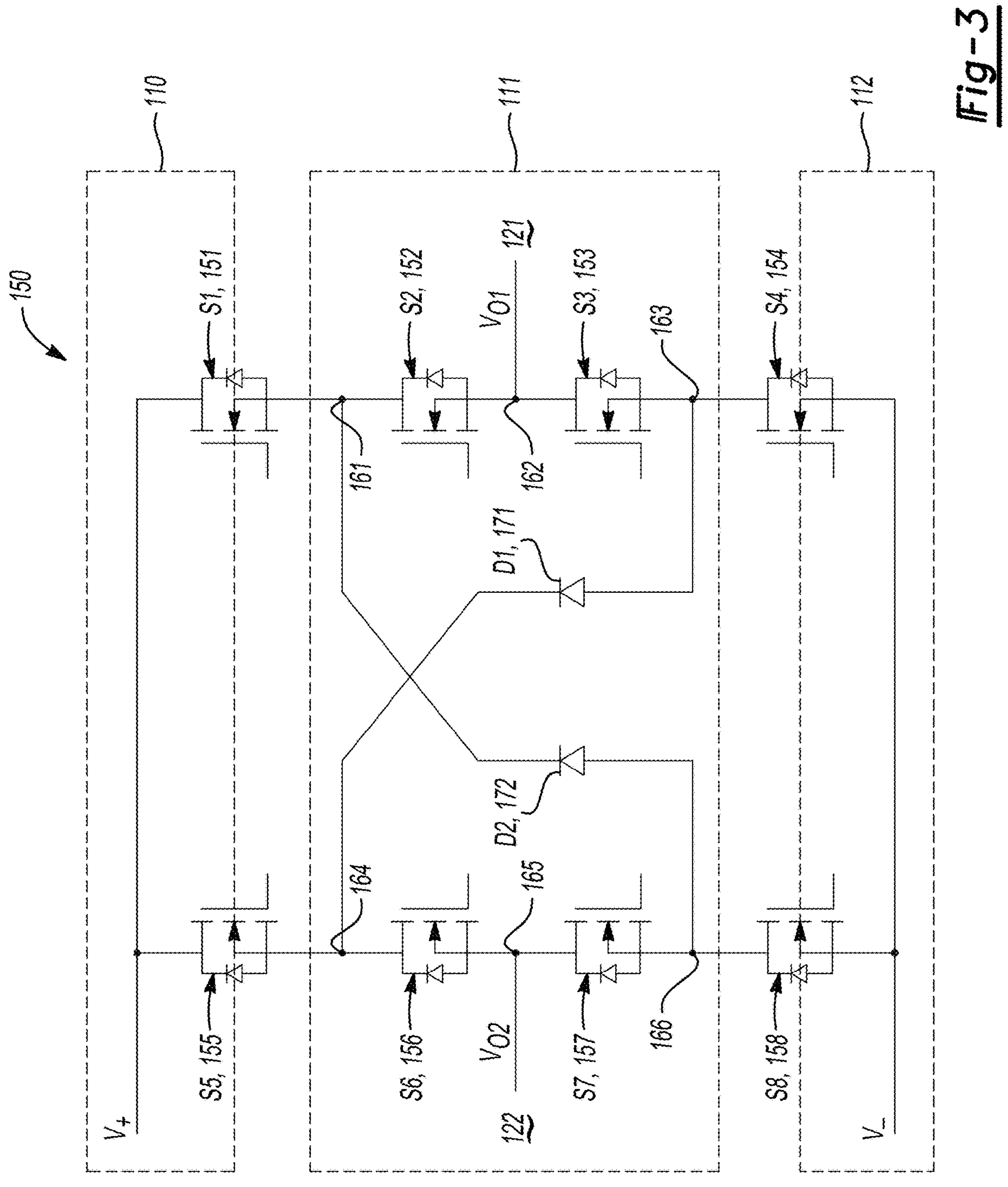
FIG. 3 schematically illustrates an electrical circuit diagram of an X-type multilevel power converter, in accordance with one aspect of the disclosure.

FIG. 3 schematically illustrates one of the X-type multilevel power converters 150, which is arranged as a solid-state integrated circuit (IC) having a plurality of semiconductor switches that are disposed in a laterally sectioned arrangement. The plurality of semiconductor switches includes, in one aspect of the disclosure and as shown, a first semiconductor switch S1 151, a second semiconductor switch S2 152, a third semiconductor switch S3 153, a fourth semiconductor switch S4 154, a fifth semiconductor switch S5 155, a sixth semiconductor switch S6 156, a seventh semiconductor switch S7 157, and an eighth semiconductor switch S8 158. In one aspect of the disclosure, at least a portion of the semiconductor switches are field-effect transistors (FETs). In one aspect of the disclosure, the FETs are gallium nitride (GaN) transistors. In one aspect of the disclosure, at least a portion of the semiconductor switches are insulated-gate bipolar transistors (IGBTs).

Other constituent elements of the X-type multilevel power converter 150 includes a first clamping diode D1 171, a second clamping diode D2 172, a positive DC power bus 110, a negative DC power bus 112, and a first auxiliary bus 111-1. The positive DC power bus 110 is connected to the positive link 102 of the high-voltage DC bus, and the negative DC power bus 112 is connected to the negative link 103 of the high-voltage DC bus.

The first semiconductor switch S1 151, the second semiconductor switch S2 152, third semiconductor switch S3 153, and the fourth semiconductor switch S4 154 are arranged in series between the positive DC power bus 110 and the negative DC power bus 112. This includes: the first semiconductor switch S1 151 being connected to the second semiconductor switch S2 152 at first node 161; the second semiconductor switch S2 152 being connected to the third semiconductor switch S3 153 at second node 162; the third semiconductor switch S3 153 being connected to the fourth semiconductor switch S4 154 at third node 163.

The fifth semiconductor switch S5 155, sixth semiconductor switch S6 156, seventh semiconductor switch S7 157, and eighth semiconductor switch S8 158 are arranged in series between the positive DC power bus 110 and the negative DC power bus 112. This includes: the fifth semiconductor switch S5 155 being connected to the sixth semiconductor switch S6 156 at fourth node 164; the sixth semiconductor switch S6 156 being connected to the seventh semiconductor switch S7 157 at fifth node 165; and the seventh semiconductor switch S7 being connected to the eighth semiconductor switch S8 158 at sixth node 166.

A first clamping diode D1 171 is arranged between the fourth node 164 and the third node 163, with the anode of the first clamping diode D1 171 being connected to the fourth node 164 and the cathode of the first clamping diode D1 171 being connected to the third node 163.

A second clamping diode D2 172 is arranged between the first node 161 and the sixth node 166, with the anode of the second clamping diode D2 172 being connected to the sixth node 166 and the cathode of the second clamping diode D2 172 being connected to the first node 161.

The first node 161 connects to the first AC power bus 121 to transfer power to the electric machine 10 (shown with reference to FIG. 2).

The second node 162 connects to the second AC power bus 122 to transfer power to the electric machine 10 (shown with reference to FIG. 2).

A positive DC power bus 110, a neutral power bus 111, and a negative DC power bus 112, are schematically illustrated.

Figure 4:
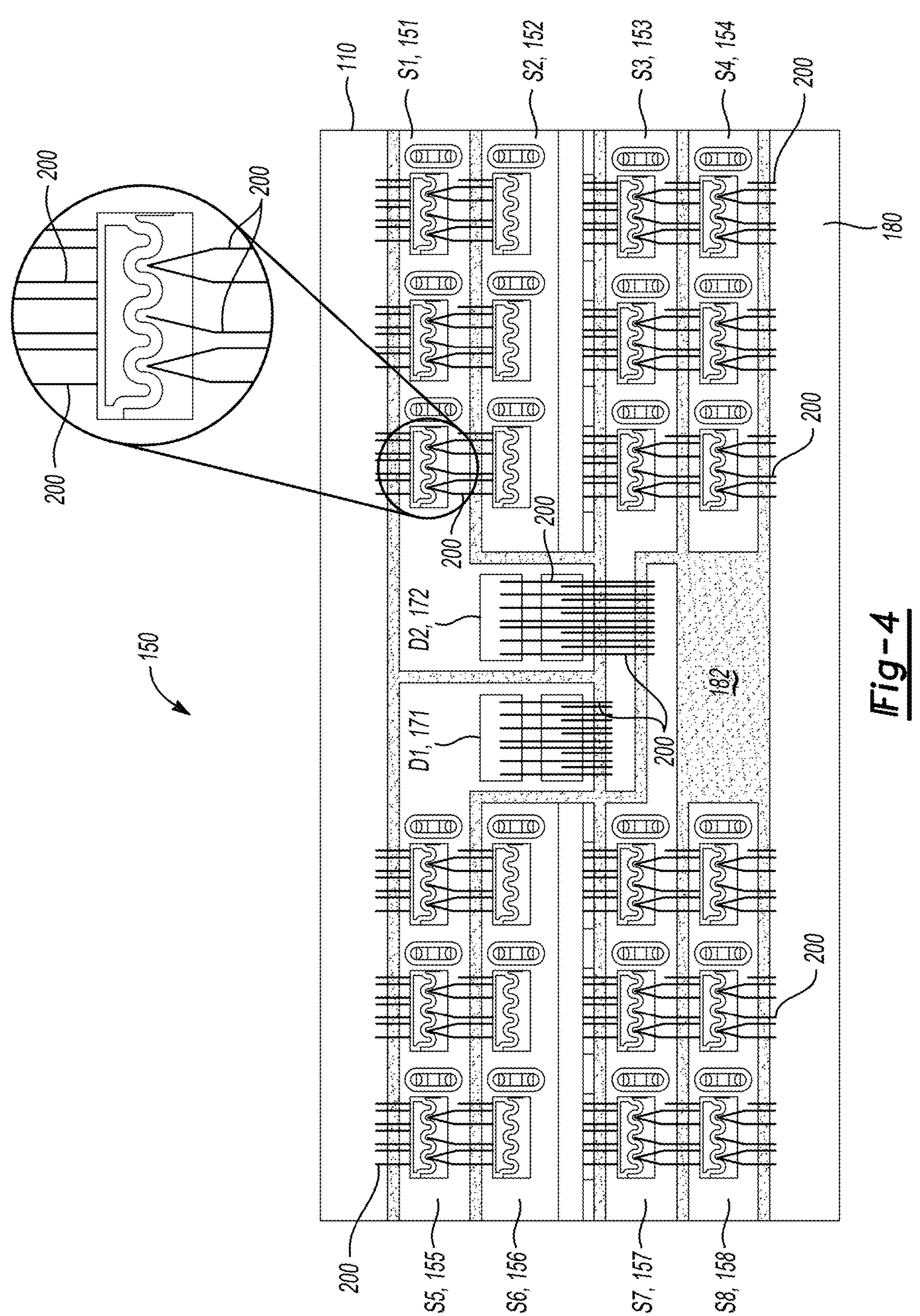
FIG. 4 schematically illustrates a top view of an X-type multilevel power converter, in accordance with one aspect of the disclosure.

As schematically illustrated in FIG. 4, X-type multilevel power converter 150 includes a plurality of semiconductor switches disposed in a laterally sectioned arrangement on a power module substrate 180. The plurality of semiconductor switches includes, in one aspect of the disclosure and as shown, a first semiconductor switch S1 151, a second semiconductor switch S2 152, a third semiconductor switch S3 153, a fourth semiconductor switch S4 154, a fifth semiconductor switch S5 155, a sixth semiconductor switch S6 156, a seventh semiconductor switch S7 157, and an eighth semiconductor switch S8 158.

The plurality of semiconductor switches, the first clamping diode D1 171, and the second clamping diode D2 172 are interconnected by a plurality of interconnections 200 on the power module substrate 180, which is disposed on an insulating substrate 182.

Figure 4A:
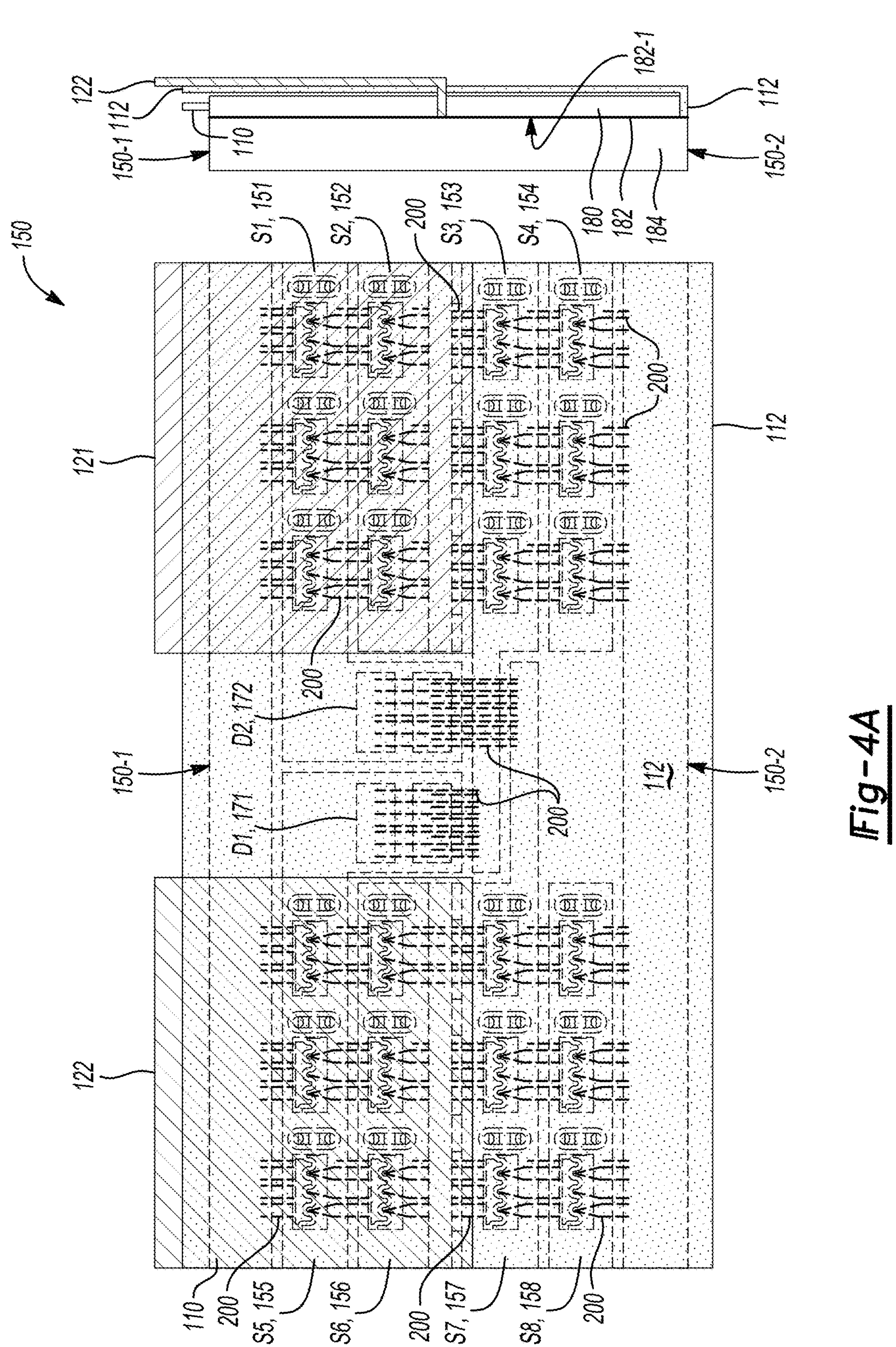
FIG. 4A schematically illustrates a top view of an X-type multilevel power converter, in accordance with one aspect of the disclosure.

As schematically illustrated in FIG. 4A with continued reference to FIG. 3, X-type multilevel power converter 150 includes a positive DC power bus 110, a negative DC power bus 112, a first alternating current (AC) bus 121, a second AC power bus 122, a first clamping diode D1 171, a second clamping diode D2 172, a power module substrate 180 disposed on an insulating substrate 182, and a heat sink 184 adjacent to a first side 182-1 of the insulating substrate 182.

The X-type multilevel power converter 150 includes a plurality of semiconductor switches including a first semiconductor switch S1 151, a second semiconductor switch S2 152, a third semiconductor switch S3 153, a fourth semiconductor switch S4 154, a fifth semiconductor switch S5 155, a sixth semiconductor switch S6 156, a seventh semiconductor switch S7 157, and an eighth semiconductor switch S8 158.

The first semiconductor switch S1 151, the second semiconductor switch S2 152, the third semiconductor switch S3 153, and the fourth semiconductor switch S4 154 are connected in series between the positive DC power bus 110 and the negative DC power bus 112.

The first semiconductor switch S1 151 is connected to the second semiconductor switch S2 152 at a first node 161. The second semiconductor switch S2 152 is connected to the third semiconductor switch S3 153 at a second node 162, and the third semiconductor switch S3 153 is connected to the fourth semiconductor switch S4 154 at a third node 163.

The fifth semiconductor switch S5 155, the sixth semiconductor switch S6 156, the seventh semiconductor switch S7 157, and the eighth semiconductor switch S8 158 is connected in series between the positive DC power bus 110 and the negative DC power bus 112.

The fifth semiconductor switch S5 155 is connected to the sixth semiconductor switch S6 156 at a fourth node 164. The sixth semiconductor switch S6 156 is connected to the seventh semiconductor switch S7 157 at a fifth node 165, and the seventh semiconductor switch S7 157 is connected to the eighth semiconductor switch S8 158 at a sixth node 166.

The first clamping diode D1 171 is connected between the third node 163 and the fourth node 164. The second clamping diode D2 172 is connected between the first node 161 and the sixth node 166.

The second node 162 is connected to the first AC power bus 121 and the fifth node 165 is connected to the second AC power bus 122.

Each of the plurality of semiconductor switches may include a plurality of lateral semiconductor dies that include gate control terminals.

The plurality of semiconductor switches, the first clamping diode D1 171, and the second clamping diode D2 172 are coplanar.

The first AC power bus 121 and the second AC power bus 122 are coplanar.

The first AC power bus 121 and the second AC power bus 122 are parallel to one another and/or laminated.

The positive DC power bus 110 and the negative DC power bus 112 are also parallel to one another.

Each of the first AC power bus 121, the second AC power bus 122, the positive DC power bus 110, and the negative DC power bus 112 each extends past a top edge 150-1 of the X-type multilevel power converter 150.

Figure 4B:
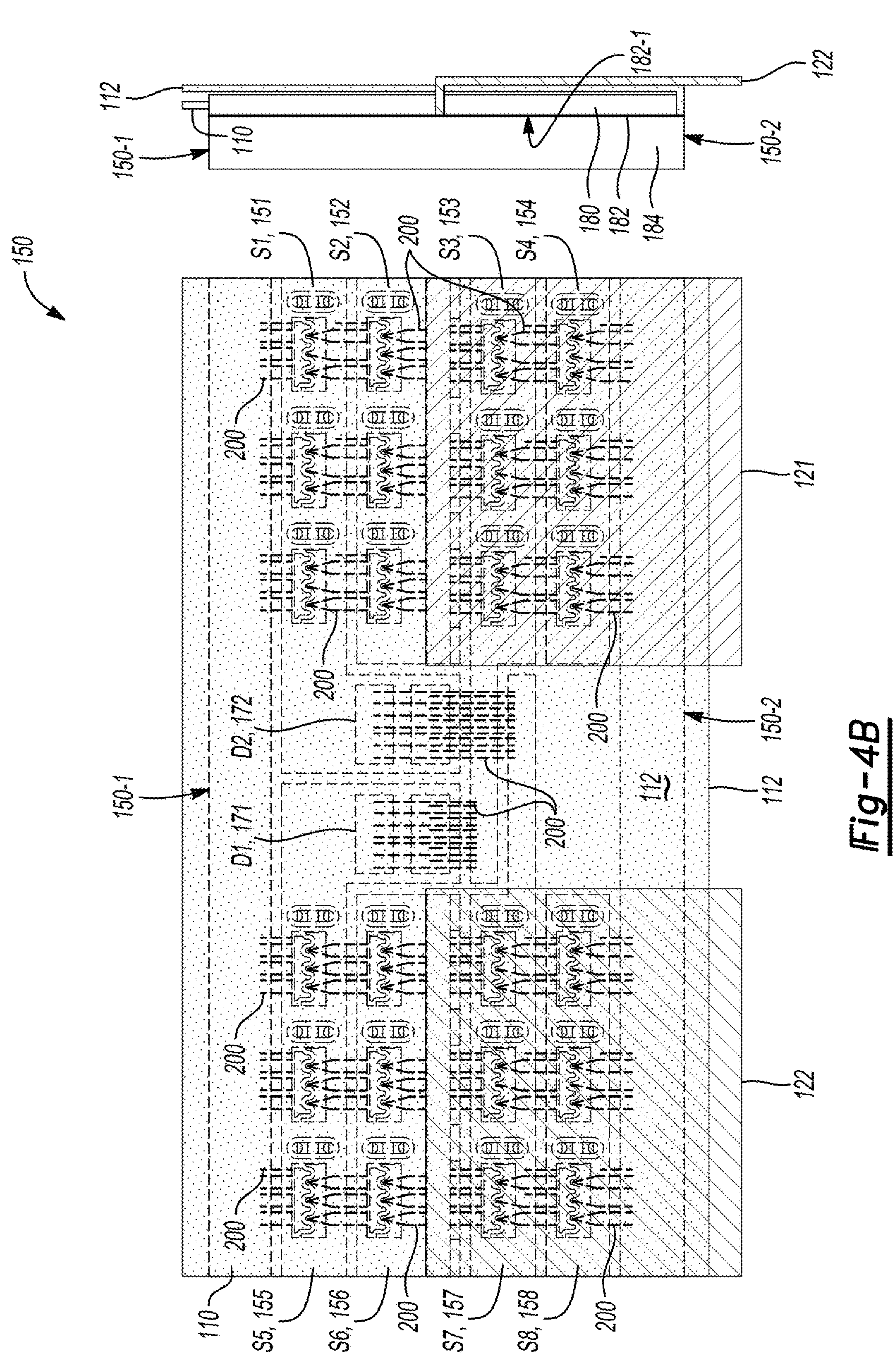
FIG. 4B schematically illustrates a top view of an X-type multilevel power converter, in accordance with one aspect of the disclosure.

According to one aspect of the disclosure, as schematically illustrated in FIG. 4B, the positive DC power bus 110 and the negative DC power bus 112 each extends past a top edge 150-1 of the X-type multilevel power converter 150, and the first AC power bus 121 and the second AC power bus 122 each extends past a bottom edge 150-2 of the X-type multilevel power converter 150.

According to one aspect of the disclosure, as schematically illustrated in FIGS. 4C1 and 4C2, the positive DC power bus 110 and the negative DC power bus 112 each extends past a top edge 150-1 of the X-type multilevel power converter 150, and the first AC power bus 121 and the second AC power bus 122 each extends perpendicularly to the X-type multilevel power converter 150 from a middle portion 150-3 of the X-type multilevel power converter 150.

Interconnections 200 may include but are not limited to one or more of wire bonding, ribbon bonding, clip bonding, and direct copper bus bonding.

Figures 5, 5A:
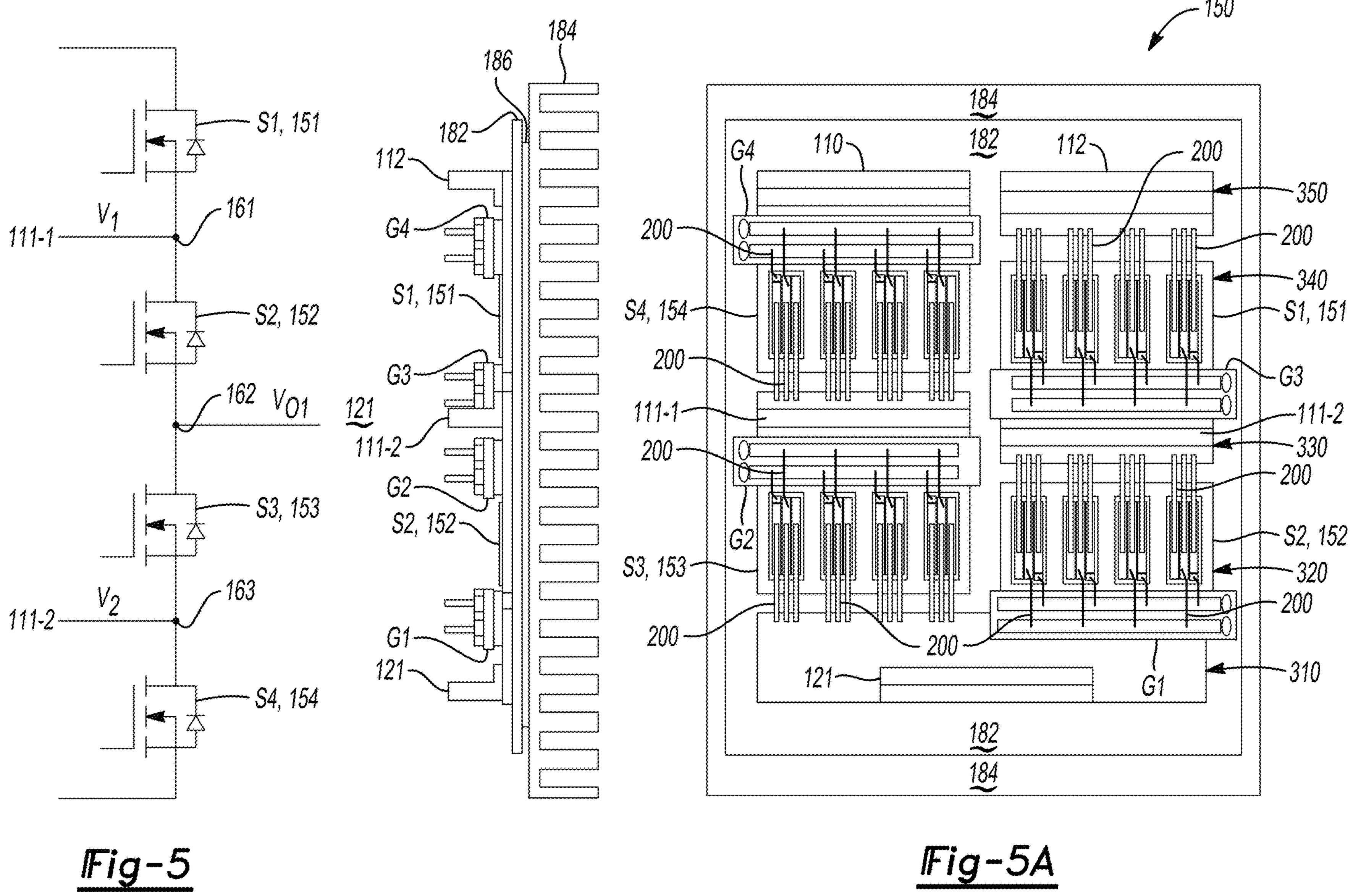
FIG. 5 schematically illustrates an electrical circuit diagram of an X-type multilevel power converter, in accordance with one aspect of the disclosure.
FIG. 5A schematically illustrates a top view of an X-type multilevel power converter, in accordance with one aspect of the disclosure.

According to another aspect of the disclosure, as schematically illustrated in FIG. 5 with continued reference to FIG. 2, a multi-phase power inverter 104 includes a plurality of X-type multilevel power converters 150 arranged to transfer electric power between a high-voltage direct current (DC) power source 101 and an electric machine 10.

Each of the plurality of X-type multilevel power converters 150 is configured as a solid-state integrated circuit (IC).

The at least one X-type multilevel power converter 150 includes a positive DC power bus 110, a negative DC power bus 112, a first alternating current (AC) bus 121, a first auxiliary bus 111-1, a second auxiliary bus 111-2, a plurality of semiconductor switches disposed on an insulating substrate board 182, the plurality of semiconductor switches including a first semiconductor switch S1 151, a second semiconductor switch S2 152, a third semiconductor switch S3 153, and a fourth semiconductor switch S4 154, and a heat sink 184 adjoined to the insulating substrate board 182 via a thermally conductive interface material 186.

The first semiconductor switch S1 151, the second semiconductor switch S2 152, the third semiconductor switch S3 153, and the fourth semiconductor switch S4 154 are connected in series between the positive DC power bus 110 and the negative DC power bus 112.

The first semiconductor switch S1 151 is connected to the second semiconductor switch S2 152 at a first node 161. The second semiconductor switch S2 152 is connected to the third semiconductor switch S3 153 at a second node 162, and the third semiconductor switch S3 153 is connected to the fourth semiconductor switch S4 154 at a third node 163.

The first node 161 is connected to the first auxiliary bus 111-1. The second node 162 is connected to the first AC power bus 121, and the third node 163 is connected to the second auxiliary bus 111-2.

The plurality of semiconductor switches, the positive DC power bus 110, the negative DC power bus 112, the first auxiliary bus 111-1, and the second auxiliary bus 111-2 are arranged in sections including a first section 310 composed of the first AC power bus 121, a second section 320 composed of the second semiconductor switch S2 152 arranged coplanar with the third semiconductor switch S3 153, a third section 330 composed of the first auxiliary bus 111-1 arranged coplanar with the second auxiliary bus 111-2, a fourth section 340 composed of the first semiconductor switch S1 151 arranged coplanar with the fourth semiconductor switch S4 154, and a fifth section 350 composed of the positive DC power bus 110 arranged coplanar with the negative DC power bus 112.

The first section 310 is adjacent to the second section 320 that is adjacent to the third section 330 that is adjacent to the fourth section 340 that is adjacent to the fifth section 350.

The first AC power bus 121 is arranged parallel to the positive DC power bus 110 and the negative DC power bus 112.

A first gate control G1 is arranged between the first section 310 and the second section and 320 and disposed adjacent to the first AC power bus 121 and the third semiconductor switch S3 153.

A second gate control G2 is arranged between the second section 320 and the third section 330 and disposed adjacent to the second semiconductor switch S2 152 and the first auxiliary bus 111-1.

A third gate control G3 is arranged between the third section 330 and the fourth section 340 and disposed adjacent to the second auxiliary bus 111-2 and the fourth semiconductor switch S4 154.

A fourth gate control G4 is arranged between the fourth section 340 and the fifth section 350 and disposed adjacent to the first semiconductor switch S1 151 and the positive DC power bus 110.

The first gate control G1 is arranged coplanar with the second gate control G2 that is arranged coplanar with the third gate control G3 that is arranged coplanar with the fourth gate control G4.

It should be appreciated that while each of the plurality of semiconductor switches are illustrated as having three dies in parallel, the number of dies can vary depending on the application.

Figures 6, 6A:
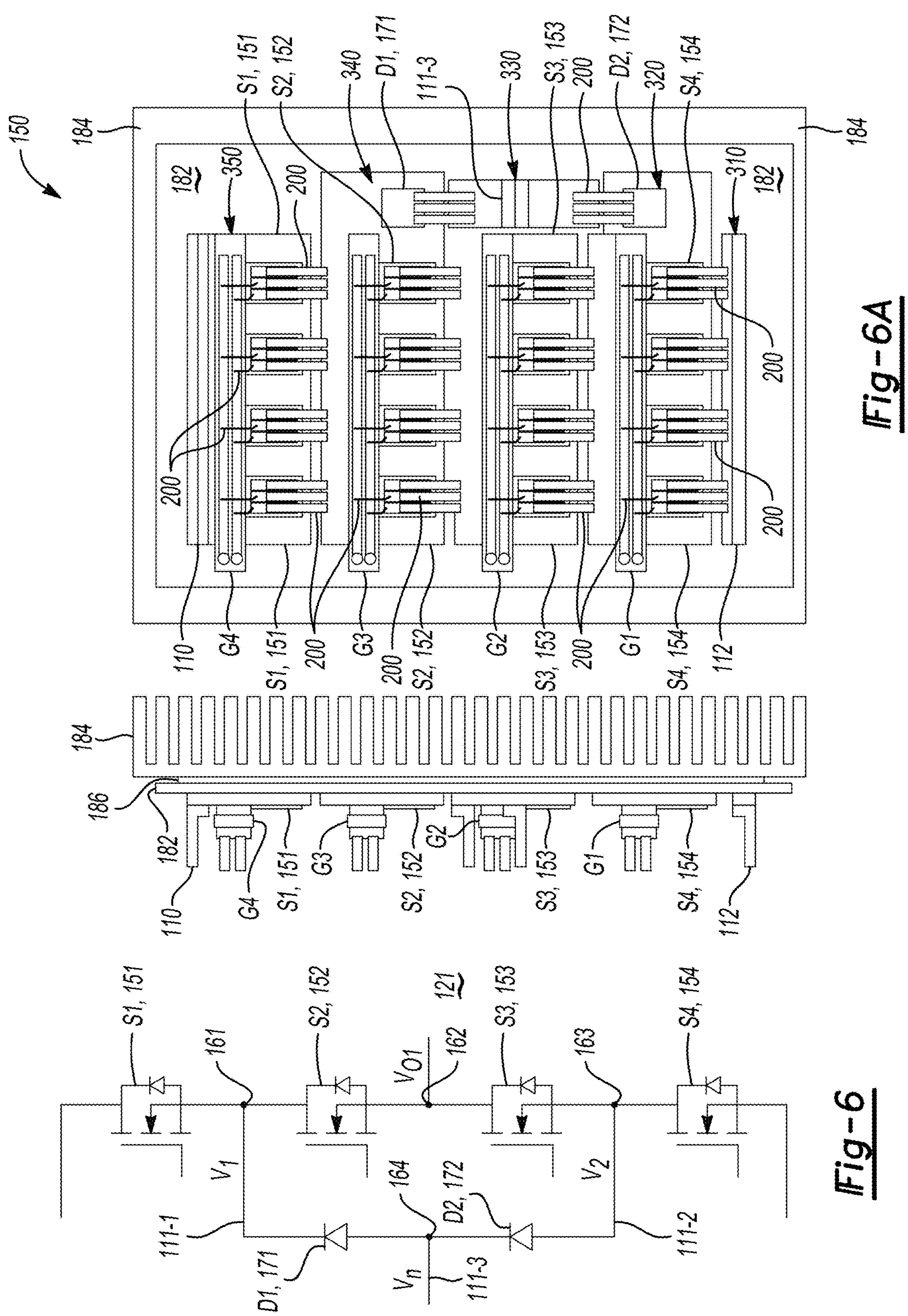
FIG. 6 schematically illustrates an electrical circuit diagram of an X-type multilevel power converter, in accordance with one aspect of the disclosure.
FIG. 6A schematically illustrates a top view of an X-type multilevel power converter, in accordance with one aspect of the disclosure.

According to another aspect of the disclosure, as schematically illustrated in FIG. 6 with continued reference to FIG. 2, a multi-phase power inverter 104 includes a plurality of X-type multilevel power converters 150 arranged to transfer electric power between a high-voltage direct current (DC) power source 101 and an electric machine 10.

Each of the plurality of X-type multilevel power converters 150 is configured as a solid-state integrated circuit (IC).

The at least one X-type multilevel power converter 150 includes a positive DC power bus 110, a negative DC power bus 112, a first alternating current (AC) bus 121, a first auxiliary bus 111-1, a second auxiliary bus 111-2, a plurality of semiconductor switches disposed on an insulating substrate board 182, the plurality of semiconductor switches including a first semiconductor switch S1 151, a second semiconductor switch S2 152, a third semiconductor switch S3 153, and a fourth semiconductor switch S4 154, and a heat sink 184 adjoined to the insulating substrate board 182 via a thermally conductive interface material 186.

The first semiconductor switch S1 151, the second semiconductor switch S2 152, the third semiconductor switch S3 153, and the fourth semiconductor switch S4 154 are connected in series between the positive DC power bus 110 and the negative DC power bus 112.

The first semiconductor switch S1 151 is connected to the second semiconductor switch S2 152 at a first node 161. The second semiconductor switch S2 152 is connected to the third semiconductor switch S3 153 at a second node 162, and the third semiconductor switch S3 153 is connected to the fourth semiconductor switch S4 154 at a third node 163.

The first node 161 is connected to the first auxiliary bus 111-1. The second node 162 is connected to the first AC power bus 121, and the third node 163 is connected to the second auxiliary bus 111-2.

As illustrated in FIG. 6A, a first clamping diode D1 171 is connected between the first node 161 and the fourth node 164 and a second clamping diode D2 172 is connected between the fourth node 164 and the third node 163.

The plurality of semiconductor switches, the positive DC power bus 110, the negative DC power bus 112, the first auxiliary bus 111-1, the second auxiliary bus 111-2, the third auxiliary bus 111-3 are arranged in sections including a first section 310 composed of the negative DC power bus 112, a second section 320 composed of the fourth semiconductor switch S4 154 and the second clamping diode D2 172, a third section 330 composed of the third semiconductor switch S3 153, the first AC power bus 121, and the third auxiliary bus 111-3, a fourth section 340 composed of the second semiconductor switch S2 152 and the first clamping diode D1 171, and a fifth section 350 composed of the first semiconductor switch S1 151 and the positive DC power bus 110.

The first section 310 is adjacent to the second section 320 that is adjacent to the third section 330 that is adjacent to the fourth section 340 that is adjacent to the fifth section 350.

The first AC power bus 121 is arranged parallel to the positive DC power bus 110 and the negative DC power bus 112.

A first gate control G1 is arranged adjacent to the fourth semiconductor switch S4 154. A second gate control G2 is arranged adjacent to the third semiconductor switch S3 153. A third gate control G3 is arranged adjacent to the second semiconductor switch S2 152 and a fourth gate control G4 is arranged adjacent to the first semiconductor switch S1 151.

The first gate control G1 is arranged coplanar with the second gate control G2 that is arranged coplanar with the third gate control G3 that is arranged coplanar with the fourth gate control G4.

Figure 6B:
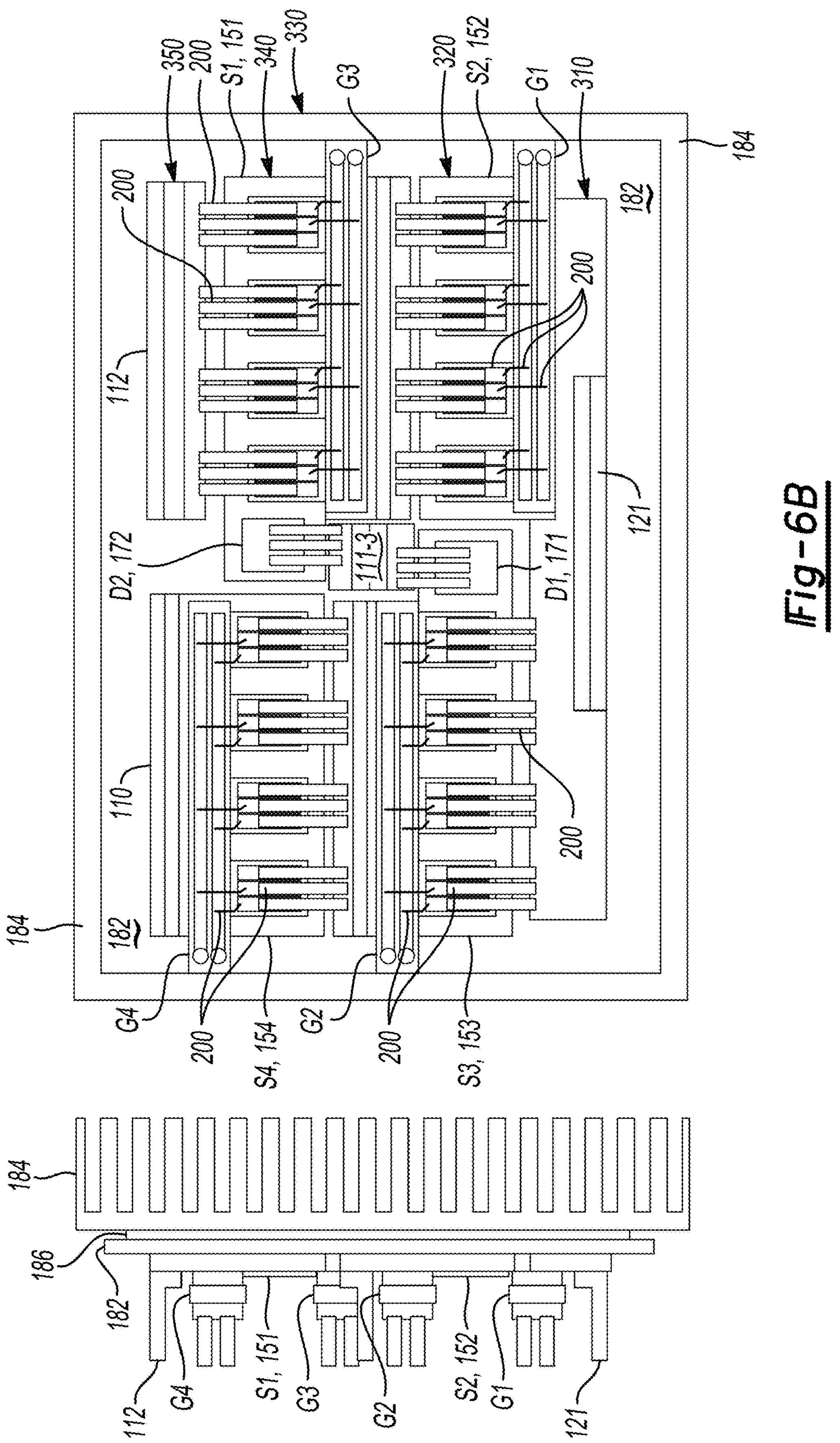
FIG. 6B schematically illustrates a top view of an X-type multilevel power converter, in accordance with one aspect of the disclosure.

As schematically illustrated in FIG. 6B, a third auxiliary bus 111-3 is connected to a fourth node 164.

The plurality of semiconductor switches, the positive DC power bus 110, the negative DC power bus 112, the first auxiliary bus 111-1, and the second auxiliary bus 111-2 are arranged in sections including a first section 310 composed of the first AC power bus 121, a second section 320 composed of the second semiconductor switch S2 152 arranged coplanar with the third semiconductor switch S3 153, a third section 330 composed of the third auxiliary bus 111-3, a fourth section 340 composed of the first semiconductor switch S1 151 arranged coplanar with the fourth semiconductor switch S4 154, and a fifth section 350 composed of the positive DC power bus 110 arranged coplanar with the negative DC power bus 112.

The first section 310 is adjacent to the second section 320 that is adjacent to the third section 330 that is adjacent to the fourth section 340 that is adjacent to the fifth section 350.

The first AC power bus 121 is arranged parallel to the positive DC power bus 110 and the negative DC power bus 112.

A first gate control G1 is arranged between the first section 310 and the second section and 320 and disposed adjacent to the first AC power bus 121 and the third semiconductor switch S3 153.

A second gate control G2 is arranged between the second section 320 and the third section 330 and disposed adjacent to the second semiconductor switch S2 152 and the first auxiliary bus 111-1.

A third gate control G3 is arranged between the third section 330 and the fourth section 340 and disposed adjacent to the second auxiliary bus 111-2 and the fourth semiconductor switch S4 154.

A fourth gate control G4 is arranged between the fourth section 340 and the fifth section 350 and disposed adjacent to the first semiconductor switch S1 151 and the positive DC power bus 110.

The first gate control G1 is arranged coplanar with the second gate control G2 that is arranged coplanar with the third gate control G3 that is arranged coplanar with the fourth gate control 340.

According to one aspect of the disclosure, as schematically illustrated in FIG. 7, the X-type multilevel power converter 150 further includes a first clamping diode D1 171, a second clamping diode D2 172, and a second AC power bus 122, as illustrated in FIG. 3.

The plurality of semiconductor switches further includes a fifth semiconductor switch S5 155, a sixth semiconductor switch S6 156, a seventh semiconductor switch S7 157, and an eighth semiconductor switch S8 158.

The fifth semiconductor switch S5 155, the sixth semiconductor switch S6 156, the seventh semiconductor switch S7 157, and the eighth semiconductor switch S8 158 are connected in series between the positive DC power bus 110 and the negative DC power bus 112.

The fifth semiconductor switch S5 155 is connected to the sixth semiconductor switch S6 156 at a fourth node 164. The sixth semiconductor switch S6 156 is connected to the seventh semiconductor switch S7 157 at a fifth node 165, and the seventh semiconductor switch S7 157 is connected to the eighth semiconductor switch at a sixth node 166.

The first clamping diode D1 171 is connected between the third node 163 and the fourth node 164 and the second clamping diode D2 172 is connected between the first node 161 and the sixth node 166.

The second node 162 is connected to the first AC power bus 121 and the fifth node 165 is connected to the second AC power bus 122.

The plurality of semiconductor switches, the positive DC power bus 110, the negative DC power bus 112, the first AC power bus 121, the second AC power bus 122, the first clamping diode D1 171, and the second clamping diode D2 172 is arranged into a plurality of sections including a first section 310 composed of the negative DC power bus 112, a second section 320 composed of the fourth semiconductor switch S4 154 arranged coplanar with the second clamping diode D2 172 that is arranged coplanar with the eighth semiconductor switch S8 158, a third section 330 composed of the third semiconductor switch S3 153 arranged coplanar with the seventh semiconductor switch S7 157, a fourth section 340 composed of the first AC power bus 121 and the second AC power bus 122, a fifth section 350 composed of the second semiconductor switch S2 152 arranged coplanar with the first clamping diode D1 171 that is arranged coplanar with the sixth semiconductor switch S6 156, a sixth section 360 composed of the first semiconductor switch S1 151 arranged coplanar with the fifth semiconductor switch S5 155, and a seventh section 370 composed of the positive DC power bus 110.

The first section 310 is adjacent to the second section 320 that is adjacent to the third section 330 that is adjacent to the fourth section 340 that is adjacent to the fifth section 350 that is adjacent to the sixth section 360 that is adjacent to the seventh section 370.

The first AC power bus 121 and the second AC power bus 122 is arranged parallel to the positive DC power bus 110 and the negative DC power bus 112.

A plurality of gate controls includes a first gate control G1 arranged adjacent to the fourth semiconductor switch S4 154, a second gate control G2 arranged adjacent to the third semiconductor switch S3 153, a third gate control G3 arranged adjacent to the second semiconductor switch S2 152, a fourth gate control G4 arranged adjacent to the first semiconductor switch S1 151, a fifth gate control G5 arranged adjacent to the fifth semiconductor switch S5 155, a sixth gate control G6 arranged adjacent to the sixth semiconductor switch S6 156, a seventh gate control G7 arranged adjacent to the seventh semiconductor switch S7 157, and an eighth gate control G8 arranged adjacent to the eighth semiconductor switch S8 158.

The first gate control G1 is arranged coplanar with the second gate control G2 that is arranged coplanar with the third gate control G3 that is arranged coplanar with the fourth gate control G4 that is coplanar with the fifth gate control G5 that is coplanar with the sixth gate control G6 that is coplanar with the seventh gate control G7 that is coplanar with the eighth gate control G8.

In the configuration illustrated in FIG. 7, the first clamping diode D1 171, and the second clamping diode D2 172 include external diode interconnects 400.

Figure 7A:
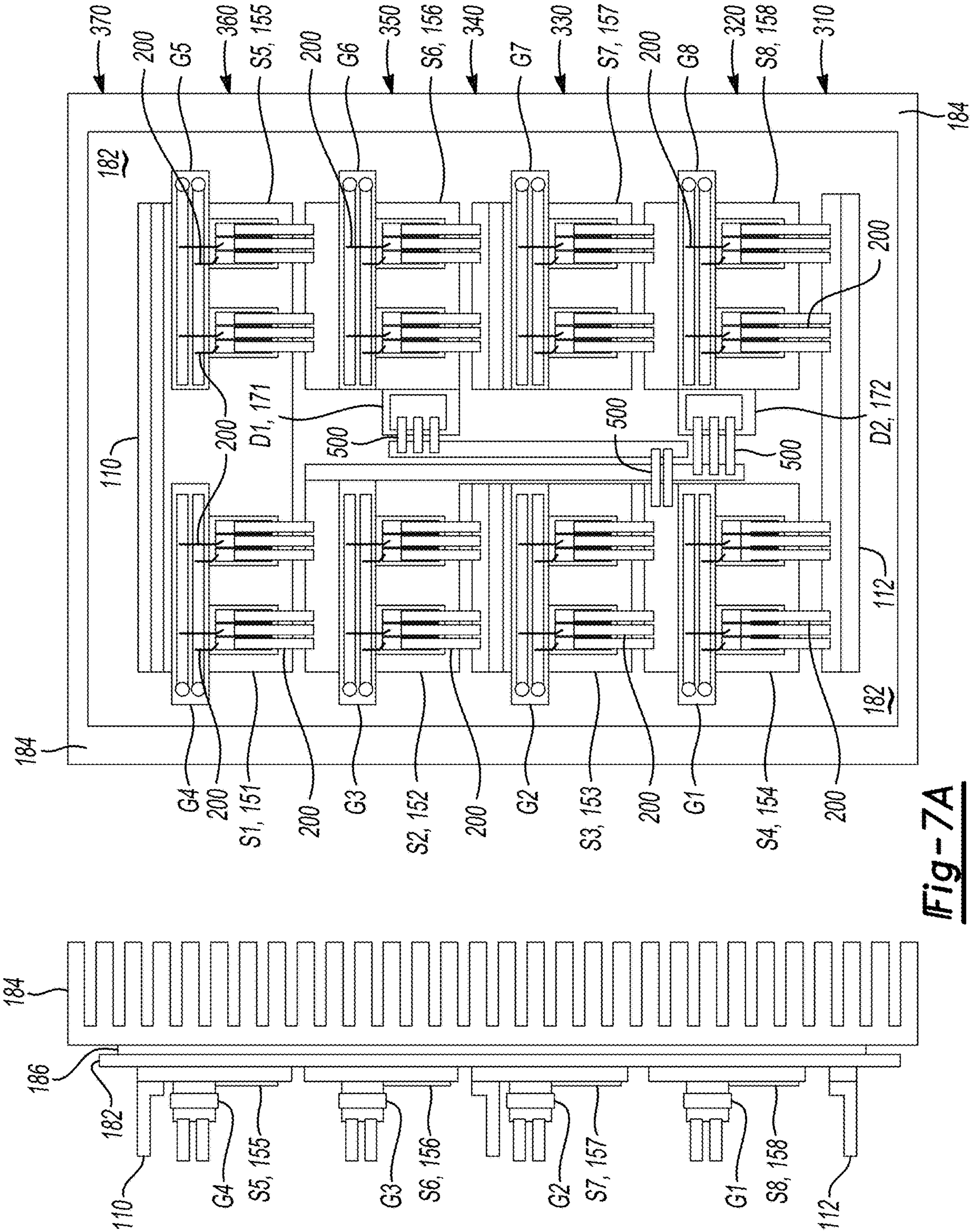
FIG. 7A schematically illustrates a top view of an X-type multilevel power converter, in accordance with one aspect of the disclosure.

In the configuration illustrated in FIG. 7A, the first clamping diode D1 171, and the second clamping diode D2 172 include internal diode interconnects 500.

An electrified vehicle 20 is also disclosed. The electrified vehicle 20 includes an electric propulsion system having an electric motor configured to provide power to the electric propulsion system.

A plurality of X-type multilevel power converters 150 are arranged to transfer electric power between a high-voltage direct current (DC) power source and an electric machine 10. Each of the plurality of X-type multilevel power converters 150 is arranged as a solid-state integrated circuit (IC).

The X-type multilevel power converter 150 includes a positive DC power bus 110, a negative DC power bus 112, a first alternating current (AC) bus 121, a second AC power bus 122, a first clamping diode D1 171, a second clamping diode D2 172, a power module substrate 180 disposed on an insulating substrate 186, and a heat sink 184 adjacent to a first side of the insulating substrate 186.

The power module substrate 180 includes a plurality of semiconductor switches including a first semiconductor switch S1 151, a second semiconductor switch S2 152, a third semiconductor switch S3 153, a fourth semiconductor switch S4 154, a fifth semiconductor switch S5 155, a sixth semiconductor switch S6 156, a seventh semiconductor switch S7 157, and an eighth semiconductor switch S8 158.

The first semiconductor switch S1 151, the second semiconductor switch S2 152, the third semiconductor switch S3 153, and the fourth semiconductor switch S4 154 are connected in series between the positive DC power bus 110 and the negative DC power bus 112.

The first semiconductor switch S1 151 is connected to the second semiconductor switch S2 152 at a first node 161. The second semiconductor switch S2 152 is connected to the third semiconductor switch S3 153 at a second node 162, and the third semiconductor switch S3 153 is connected to the fourth semiconductor switch S4 154 at a third node 163.

The fifth semiconductor switch S5 155, the sixth semiconductor switch S6 156, the seventh semiconductor switch S7 157, and the eighth semiconductor switch S8 158 is connected in series between the positive DC power bus 110 and the negative DC power bus 112.

The fifth semiconductor switch S5 155 is connected to the sixth semiconductor switch S6 156 at a fourth node 164. The sixth semiconductor switch S6 156 is connected to the seventh semiconductor switch S7 157 at a fifth node 165, and the seventh semiconductor switch S7 157 is connected to the eighth semiconductor switch S8 158 at a sixth node 166.

The first clamping diode D1 171 is connected between the third node 163 and the fourth node 164 and the second clamping diode D2 172 is connected between the first node 161 and the sixth node 166.

The second node 162 is connected to the first AC power bus 121 and the fifth node 165 is connected to the second AC power bus 122.

Each of the plurality of semiconductor switches includes a plurality of lateral semiconductor dies, and may include gate control terminals, as discussed above.

The plurality of semiconductor switches, the first clamping diode D1 171, and the second clamping diode D2 172 may be coplanar.

The first AC power bus 121 and the second AC power bus 122 may be parallel to one another.

By configuring the topology within each of the X-type multilevel converters 150 such that both the positive DC power bus 110 and the negative DC power bus 112 are parallel with the neutral bus 111, mutual inductance cancellation minimizes parasitic inductance by coupling positive mutual inductance and negative mutual inductance for commutation loop currents within each of the X-type multilevel converters 150.

Further, including clamping diodes internal to the X-type multilevel converter 150 also reduces the commutation loop within the X-type multilevel converter.

The concepts and aspects of the disclosure described herein facilitate various heat transfer and cooling systems, including direct cooling, indirect cooling, immersive cooling, single-sided or double-sided cooling.

These and other attendant benefits of the present disclosure will be appreciated by those skilled in the art in view of the foregoing disclosure.

The detailed description and the drawings or figures are supportive and descriptive of the present teachings, but the scope of the present teachings is defined solely by the claims. While some of the best modes and other examples for carrying out the present teachings have been described in detail, various alternative designs and aspects of the disclosure exist for practicing the present teachings defined in the appended claims.

What is claimed is:

1. A multi-phase power inverter for an electric propulsion system, the multi-phase power inverter comprising:

a plurality of X-type multilevel power converters arranged to transfer electric power between a high-voltage direct current (DC) power source and an electric machine, wherein each of the plurality of X-type multilevel power converters is a solid-state integrated circuit (IC) including:

a positive DC power bus;

a negative DC power bus;

a first alternating current (AC) bus;

a second AC power bus;

a first clamping diode;

a second clamping diode;

a power module substrate disposed on an insulating substrate;

a heat sink adjacent to a first side of the insulating substrate; and wherein the power module substrate includes:

a plurality of semiconductor switches including a first semiconductor switch, a second semiconductor switch, a third semiconductor switch, a fourth semiconductor switch, a fifth semiconductor switch, a sixth semiconductor switch, a seventh semiconductor switch, and an eighth semiconductor switch;

wherein the first semiconductor switch, the second semiconductor switch, the third semiconductor switch, and the fourth semiconductor switch are connected in series between the positive DC power bus and the negative DC power bus;

wherein the first semiconductor switch is connected to the second semiconductor switch at a first node, wherein the second semiconductor switch is connected to the third semiconductor switch at a second node, and wherein the third semiconductor switch is connected to the fourth semiconductor switch at a third node;

wherein the fifth semiconductor switch, the sixth semiconductor switch, the seventh semiconductor switch, and the eighth semiconductor switch are connected in series between the positive DC power bus and the negative DC power bus;

wherein the fifth semiconductor switch is connected to the sixth semiconductor switch at a fourth node, wherein the sixth semiconductor switch is connected to the seventh semiconductor switch at a fifth node, and wherein the seventh semiconductor switch is connected to the eighth semiconductor switch at a sixth node;

wherein the first clamping diode is connected between the third node and the fourth node;

wherein the second clamping diode is connected between the first node and the sixth node;

wherein the second node is connected to the first AC power bus;

wherein the fifth node is connected to the second AC power bus;

wherein each of the plurality of semiconductor switches includes a plurality of lateral semiconductor dies, and wherein each of the plurality of lateral semiconductor dies includes gate control terminals; and wherein the plurality of semiconductor switches, the first clamping diode, and the second clamping diode are coplanar.

2. The multi-phase power inverter as recited in claim 1, wherein the first AC power bus and the second AC power bus are coplanar.

3. The multi-phase power inverter as recited in claim 1, wherein the first AC power bus and the second AC power bus are parallel to one another.

4. The multi-phase power inverter as recited in claim 1, wherein the first AC power bus and the second AC power bus are laminated.

5. The multi-phase power inverter as recited in claim 1, wherein the positive DC power bus and the negative DC power bus are parallel to one another.

6. The multi-phase power inverter as recited in claim 1, wherein each of the first AC power bus, the second AC power bus, the positive DC power bus, and the negative DC power bus extend past a top edge of the X-type multilevel power converter.

7. The multi-phase power inverter as recited in claim 1, wherein the positive DC power bus and the negative DC power bus extend past a top edge of the X-type multilevel power converter, and wherein the first AC power bus and the second AC power bus extend past a bottom edge of the X-type multilevel power converter.

8. The multi-phase power inverter as recited in claim 1, wherein the positive DC power bus and the negative DC power bus extend past a top edge of the X-type multilevel power converter, and wherein the first AC power bus and the second AC power bus extending perpendicular to the X-type multilevel power converter from a middle portion of the X-type multilevel power converter.

9. The multi-phase power inverter as recited in claim 1, wherein interconnections include one or more of wire bonding, ribbon bonding, clip bonding, and direct copper bus bonding.

10. A multi-phase power inverter for an electric propulsion system, the multi-phase power inverter comprising:

a plurality of X-type multilevel power converters arranged to transfer electric power between a high-voltage direct current (DC) power source and an electric machine, wherein each of the plurality of X-type multilevel power converters is a solid-state integrated circuit (IC) including:

a positive DC power bus;

a negative DC power bus;

a first alternating current (AC) bus;

a first auxiliary bus;

a second auxiliary bus;

a plurality of semiconductor switches disposed on an insulating substrate board, the plurality of semiconductor switches including a first semiconductor switch, a second semiconductor switch, a third semiconductor switch, and a fourth semiconductor switch;

a heat sink adjoined to the insulating substrate board via a thermally conductive interface material;

wherein the first semiconductor switch, the second semiconductor switch, the third semiconductor switch, and the fourth semiconductor switch are connected in series between the positive DC power bus and the negative DC power bus;

wherein the first semiconductor switch is connected to the second semiconductor switch at a first node, wherein the second semiconductor switch is connected to the third semiconductor switch at a second node, and wherein the third semiconductor switch is connected to the fourth semiconductor switch at a third node;

wherein the first node is connected to the first auxiliary bus;

wherein the second node is connected to the first AC power bus; and wherein the third node is connected to the second auxiliary bus.

11. The multi-phase power inverter as recited in claim 10, wherein the plurality of semiconductor switches, the positive DC power bus, the negative DC power bus, the first auxiliary bus, and the second auxiliary bus are arranged in sections including:

a first section composed of the first AC power bus;

a second section composed of the second semiconductor switch arranged coplanar with the third semiconductor switch;

a third section composed of the first auxiliary bus arranged coplanar with the second auxiliary bus;

a fourth section composed of the first semiconductor switch arranged coplanar with the fourth semiconductor switch;

a fifth section composed of the positive DC power bus arranged coplanar with the negative DC power bus;

wherein the first section is adjacent to the second section that is adjacent to the third section that is adjacent to the fourth section that is adjacent to the fifth section; and wherein the first AC power bus is arranged parallel to the positive DC power bus and the negative DC power bus.

12. The multi-phase inverter as recited in claim 11, further including:

a first gate control arranged between the first section and the second section, the first gate control being disposed adjacent to the first AC power bus and the third semiconductor switch;

a second gate control arranged between the second section and the third section, the second gate control being disposed adjacent to the second semiconductor switch and the first auxiliary bus;

a third gate control arranged between the third section and the fourth section, the third gate control being disposed adjacent to the second auxiliary bus and the fourth semiconductor switch;

a fourth gate control arranged between the fourth section and the fifth section, the fourth gate control being disposed adjacent to the first semiconductor switch and the positive DC power bus; and wherein the first gate control is arranged coplanar with the second gate control that is arranged coplanar with the third gate control that is arranged coplanar with the fourth gate control.

13. The multi-phase power inverter as recited in claim 10, further including:

a third auxiliary bus connected to a fourth node; and a first clamping diode, and a second clamping diode;

wherein the first clamping diode is connected between the first node and the fourth node; and wherein the second clamping diode is connected between the fourth node and the third node.

14. The multi-phase power inverter as recited in claim 13, wherein the plurality of semiconductor switches, the positive DC power bus, the negative DC power bus, the first auxiliary bus, the second auxiliary bus, the third auxiliary bus are arranged in sections including:

a first section composed of the negative DC power bus;

a second section composed of the fourth semiconductor switch and the second clamping diode;

a third section composed of the third semiconductor switch, the first AC power bus, and the third auxiliary bus;

a fourth section composed of the second semiconductor switch and the first clamping diode; and a fifth section composed of the first semiconductor switch and the positive DC power bus;

wherein the first section is adjacent to the second section that is adjacent to the third section that is adjacent to the fourth section that is adjacent to the fifth section; and wherein the first AC power bus is arranged parallel to the positive DC power bus and the negative DC power bus.

15. The multi-phase power inverter as recited in claim 14, further including:

a first gate control arranged adjacent to the fourth semiconductor switch;

a second gate control arranged adjacent to the third semiconductor switch;

a third gate control arranged adjacent to the second semiconductor switch; and a fourth gate control arranged adjacent to the first semiconductor switch, wherein the first gate control is arranged coplanar with the second gate control that is arranged coplanar with the third gate control that is arranged coplanar with the fourth gate control.

16. The multi-phase power inverter as recited in claim 10, further including:

a first clamping diode and a second clamping diode;

a second AC power bus;

wherein the plurality of semiconductor switches further includes:

a fifth semiconductor switch;

a sixth semiconductor switch;

a seventh semiconductor switch; and an eighth semiconductor switch;

wherein the fifth semiconductor switch, the sixth semiconductor switch, the seventh semiconductor switch, and the eighth semiconductor switch are connected in series between the positive DC power bus and the negative DC power bus;

wherein the fifth semiconductor switch is connected to the sixth semiconductor switch at a fourth node, wherein the sixth semiconductor switch is connected to the seventh semiconductor switch at a fifth node, and wherein the seventh semiconductor switch is connected to the eighth semiconductor switch at a sixth node;

wherein the first clamping diode is connected between the third node and the fourth node;

wherein the second clamping diode is connected between the first node and the sixth node;

wherein the second node is connected to the first AC power bus; and wherein the fifth node is connected to the second AC power bus.

17. The multi-phase inverter as recited in claim 16, wherein the plurality of semiconductor switches, the positive DC power bus, the negative DC power bus, the first AC power bus, the second AC power bus, the first clamping diode, and the second clamping diode are arranged into a plurality of sections including:

a first section composed of the negative DC power bus;

a second section composed of the fourth semiconductor switch arranged coplanar with the second clamping diode that is arranged coplanar with the eighth semiconductor switch;

a third section composed of the third semiconductor switch arranged coplanar with the seventh semiconductor switch;

a fourth section composed of the first AC power bus and the second AC power bus;

a fifth section composed of the second semiconductor switch arranged coplanar with the first clamping diode that is arranged coplanar with the sixth semiconductor switch;

a sixth section composed of the first semiconductor switch arranged coplanar with the fifth semiconductor switch;

a seventh section composed of the positive DC power bus;

wherein the first section is adjacent to the second section that is adjacent to the third section that is adjacent to the fourth section that is adjacent to the fifth section that is adjacent to the sixth section; and wherein the first AC power bus and the second AC power bus are arranged parallel to the positive DC power bus and the negative DC power bus.

18. The multi-phase inverter as recited in claim 17, further including a plurality of gate control including:

a first gate control arranged adjacent to the fourth semiconductor switch;

a second gate control arranged adjacent to the third semiconductor switch;

a third gate control arranged adjacent to the second semiconductor switch;

a fourth gate control arranged adjacent to the first semiconductor switch;

a fifth gate control arranged adjacent to the fifth semiconductor switch;

a sixth gate control arranged adjacent to the sixth semiconductor switch;

a seventh gate control arranged adjacent to the seventh semiconductor switch;

an eighth gate control arranged adjacent to the eighth semiconductor switch; and wherein the first gate control is arranged coplanar with the second gate control that is arranged coplanar with the third gate control that is arranged coplanar with the fourth gate control that is coplanar with the fifth gate control that is coplanar with the sixth gate control that is coplanar with the seventh gate control that is coplanar with the eighth gate control.

19. An electrified vehicle comprising:

an electric propulsion system including:

an electric motor configured to provide power to the electric propulsion system;

a plurality of X-type multilevel power converters arranged to transfer electric power between a high-voltage direct current (DC) power source and an electric machine, wherein each of the plurality of X-type multilevel power converters is a solid-state integrated circuit (IC) including:

a positive DC power bus;

a negative DC power bus;

a first alternating current (AC) bus;

a second AC power bus;

a first clamping diode;

a second clamping diode;

a power module substrate disposed on an insulating substrate;

a heat sink adjacent to a first side of the insulating substrate; and wherein the power module substrate includes:

a plurality of semiconductor switches including a first semiconductor switch, a second semiconductor switch, a third semiconductor switch, a fourth semiconductor switch, a fifth semiconductor switch, a sixth semiconductor switch, a seventh semiconductor switch, and an eighth semiconductor switch;

wherein the first semiconductor switch, the second semiconductor switch, the third semiconductor switch, and the fourth semiconductor switch are connected in series between the positive DC power bus and the negative DC power bus;

wherein the first semiconductor switch is connected to the second semiconductor switch at a first node, wherein the second semiconductor switch is connected to the third semiconductor switch at a second node, and wherein the third semiconductor switch is connected to the fourth semiconductor switch at a third node;

wherein the fifth semiconductor switch, the sixth semiconductor switch, the seventh semiconductor switch, and the eighth semiconductor switch are connected in series between the positive DC power bus and the negative DC power bus;

wherein the fifth semiconductor switch is connected to the sixth semiconductor switch at a fourth node, wherein the sixth semiconductor switch is connected to the seventh semiconductor switch at a fifth node, and wherein the seventh semiconductor switch is connected to the eighth semiconductor switch at a sixth node;

wherein the first clamping diode is connected between the third node and the fourth node;

wherein the second clamping diode is connected between the first node and the sixth node;

wherein the second node is connected to the first AC power bus;

wherein the fifth node is connected to the second AC power bus;

wherein each of the plurality of semiconductor switches includes a plurality of lateral semiconductor dies, and wherein each of the plurality of lateral semiconductor dies includes gate control terminals; and wherein the plurality of semiconductor switches, the first clamping diode, and the second clamping diode are coplanar.

20. The multi-phase power inverter as recited in claim 1, wherein the first AC power bus and the second AC power bus are parallel to one another.

* * * * *